(12) United States Patent
Yamashita

(10) Patent No.: US 10,559,548 B2
(45) Date of Patent: Feb. 11, 2020

(54) ANISOTROPIC CONDUCTIVE BONDING MEMBER, SEMICONDUCTOR DEVICE, SEMICONDUCTOR PACKAGE AND SEMICONDUCTOR DEVICE PRODUCTION METHOD

(71) Applicant: FUJIFILM Corporation, Tokyo (JP)

(72) Inventor: Kosuke Yamashita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/055,734

(22) Filed: Aug. 6, 2018

(65) Prior Publication Data

US 2018/0350769 A1 Dec. 6, 2018

Related U.S. Application Data

(63) Continuation of application No. PCT/JP2017/003589, filed on Feb. 1, 2017.

(30) Foreign Application Priority Data

| | | |
|---|---|---|
| Feb. 29, 2016 | (JP) | 2016-037514 |
| Aug. 31, 2016 | (JP) | 2016-168958 |
| Sep. 21, 2016 | (JP) | 2016-183963 |

(51) Int. Cl.
  *H01L 23/52* (2006.01)
  *H01L 23/00* (2006.01)
  *H01L 21/768* (2006.01)

(52) U.S. Cl.
  CPC ........ *H01L 24/83* (2013.01); *H01L 21/76841* (2013.01); *H01L 21/76877* (2013.01); *H01L 24/27* (2013.01); *H01L 24/33* (2013.01)

(58) Field of Classification Search
  CPC ......... H01L 21/76841; H01L 21/76877; H01L 24/27; H01L 24/33; H01L 24/83

(Continued)

(56) References Cited

U.S. PATENT DOCUMENTS 5,438,223 A * 8/1995 Higashi ............. H01L 23/49827
                                                              257/734
5,819,406 A * 10/1998 Yoshizawa ............. H05K 3/325
                                                              29/877

(Continued)

FOREIGN PATENT DOCUMENTS

| JP | 62-234804 A | 10/1987 |
| JP | 10-245528 A | 9/1998 |

(Continued)

OTHER PUBLICATIONS

Communication dated Feb. 5, 2019 from the Japanese Patent Office in application No. 2018-502961.

(Continued)

*Primary Examiner* — Luan C Thai
(74) *Attorney, Agent, or Firm* — Sughrue Mion, PLLC

(57) ABSTRACT

An object of the present invention is to provide an anisotropic conductive bonding member capable of achieving excellent conduction reliability and insulation reliability, a semiconductor device using the same, a semiconductor package, and a semiconductor device production method. An anisotropic conductive bonding member of the present invention includes an insulating base which is made of an inorganic material, a plurality of conductive paths which are made of a conductive member, penetrate the insulating base in a thickness direction thereof, and are provided in a mutually insulated state, and a pressure sensitive adhesive layer which is provided on a surface of the insulating base, in which each of the conductive paths has a protrusion protruding from the surface of the insulating base, the protrusion of each of the conductive paths is buried in the pressure sensitive adhesive layer, and the pressure sensitive adhesive layer contains a polymer material and an antioxidant material.

17 Claims, 12 Drawing Sheets

(58) Field of Classification Search
USPC .......................................................... 257/692
See application file for complete search history.

(56) References Cited

U.S. PATENT DOCUMENTS

| 8,008,582 | B2* | 8/2011 | Shimada ........... H01L 23/49827 |
| | | | 174/257 |
| 8,516,690 | B2* | 8/2013 | Hatanaka .......... H01L 23/49827 |
| | | | 257/2 |
| 2011/0095419 | A1 | 4/2011 | Horiuchi et al. |
| 2011/0117357 | A1 | 5/2011 | Hatanaka et al. |
| 2017/0125330 | A1 | 5/2017 | Hotta et al. |

FOREIGN PATENT DOCUMENTS

| JP | 2010-067589 A | 3/2010 |
| JP | 2011-090865 A | 5/2011 |
| KR | 10-2007-0116661 A | 12/2007 |
| WO | 2016006660 A1 | 1/2016 |

OTHER PUBLICATIONS

International Preliminary Report on Patentability with translation of Written Opinion dated Sep. 4, 2018 from the International Bureau in counterpart International Application No. PCT/JP2017/003589.
Written Opinion issued by the International Searching Authority in corresponding International Application No. PCT/JP2017/003589, dated Apr. 11, 2017.
International Search Report, issued by International Searching Authority in corresponding International Application No. PCT/JP2017/003589, dated Apr. 11, 2017.
Communication dated Nov. 8, 2019, issued by the Korean Intellectual Property Office in corresponding Korean Application No. 10-2018-7024422.

* cited by examiner

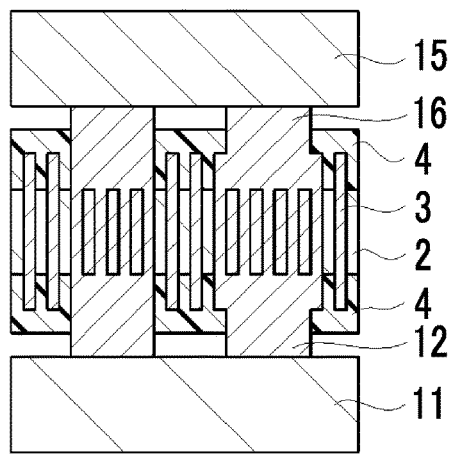
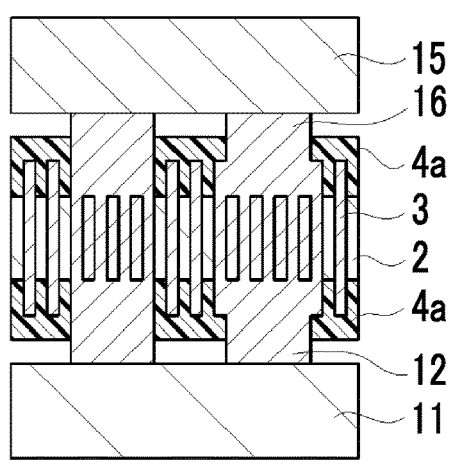
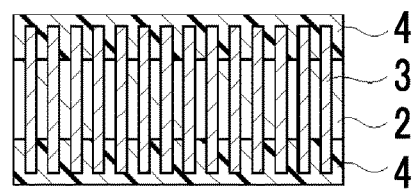
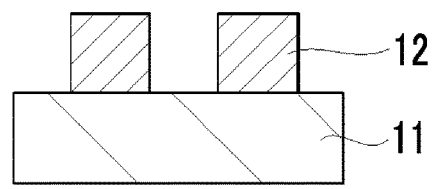

ANISOTROPIC CONDUCTIVE BONDING MEMBER, SEMICONDUCTOR DEVICE, SEMICONDUCTOR PACKAGE AND SEMICONDUCTOR DEVICE PRODUCTION METHOD

CROSS-REFERENCE TO RELATED APPLICATIONS

This application is a Continuation of PCT International Application No. PCT/JP2017/003589 filed on Feb. 1, 2017, which claims priority under 35 U.S.C. § 119(a) to Japanese Patent Application No. 2016-037514 filed on Feb. 29, 2016, Japanese Patent Application No. 2016-168958 filed on Aug. 31, 2016 and Japanese Patent Application No. 2016-183963 filed on Sep. 21, 2016. Each of the above applications is hereby expressly incorporated by reference, in its entirety, into the present application.

BACKGROUND OF THE INVENTION

1. Field of the Invention

The present invention relates to an anisotropic conductive bonding member, a semiconductor device, a semiconductor package, and a semiconductor device production method.

2. Description of the Related Art

A metal-filled microstructure (device) that is obtained by filling micropores provided in an insulating base with a metal is one of the fields which have attracted attention in recent nanotechnologies. For example, it is expected that a metal-filled microstructure will be used for an anisotropic conductive bonding member.

This anisotropic conductive bonding member is inserted between an electronic component such as a semiconductor element and a circuit board, and electrical connection is obtained between the electronic component and the circuit board by simply applying pressure to the anisotropic conductive bonding member. Thus, an anisotropic conductive bonding member is widely used, for example, as an electrical connection member for an electronic component such as a semiconductor element or as a connector for inspection in a functional test.

Particularly, downsizing of electronic components such as a semiconductor element remarkably occurs and conventional methods such as wire bonding in which wiring substrates are directly connected to each other, flip chip bonding, thermo compression (thermocompression) bonding, and the like cannot secure sufficient connection stability. Thus, an anisotropic conductive bonding member is attracting attention as an electronic connection member.

As a microstructure which can be used for such an anisotropic conductive bonding member, for example, JP2010-067589A discloses a "microstructure including an insulating base having micropore through-holes having a pore diameter of 10 to 500 nm at a density of $1 \times 10^6$ to $1 \times 10^{10}/mm^2$, in which the micropore through-holes are filled with a metal at a filling rate of 30% or more, and a layer made of a polymer is provided on at least one surface of the insulating base" ([Claim 1]).

SUMMARY OF THE INVENTION

As a result of conducting investigations on the microstructure described in JP2010-067589A, the present inventors have found that depending on the material and thickness of the polymer layer, the shape and pitch of the electrodes to be connected, and the like, conduction reliability and insulation reliability deteriorate in some cases due to effects of oxidation of the conductive path, migration of the metal used in the conductive path, remaining of an inorganic filler between the conductive paths, and the like.

Here, an object of the present invention is to provide an anisotropic conductive bonding member capable of achieving excellent conduction reliability and insulation reliability, a semiconductor device using the same, a semiconductor package, and a semiconductor device production method.

As a result of conducting intensive investigations to achieve the above object, the present inventors have found that a pressure sensitive adhesive layer provided on a surface of an insulating base contains an antioxidant material and protrusions of conductive paths which protrude from the insulating base are buried in the pressure sensitive adhesive layer so that excellent conduction reliability and insulation reliability can be achieved. Thus, the present invention has been accomplished.

That is, the present inventors have found that the above object can be achieved by adopting the following configurations.

[1] An anisotropic conductive bonding member comprising:
an insulating base which is made of an inorganic material;
a plurality of conductive paths which are made of a conductive member, penetrate the insulating base in a thickness direction thereof, and are provided in a mutually insulated state; and
a pressure sensitive adhesive layer which is provided on a surface of the insulating base,
in which each of the conductive paths has a protrusion protruding from the surface of the insulating base,
the protrusion of each of the conductive paths is buried in the pressure sensitive adhesive layer, and
the pressure sensitive adhesive layer contains an antioxidant material and a polymer material.

[2] The anisotropic conductive bonding member according to [1], in which an aspect ratio of the protrusion of each of the conductive paths is 0.5 or more and less than 50, where the aspect ratio is a ratio of height to diameter of the protrusion.

[3] The anisotropic conductive bonding member according to [1] or [2], in which a height of the protrusion of each of the conductive paths is 50 nm to 3,000 nm.

[4] The anisotropic conductive bonding member according to any one of [1] to [3], in which a thickness of the pressure sensitive adhesive layer is larger than the height of the protrusion of each of the conductive paths and is 100 μm or less.

[5] The anisotropic conductive bonding member according to any one of [1] to [4], in which a difference between the height of the protrusion of each of the conductive paths and the thickness of the pressure sensitive adhesive layer is 1 nm to 99.95 μm.

[6] The anisotropic conductive bonding member according to any one of [1] to [5], in which the polymer material is at least one resin material selected from the group consisting of polyimide resins and epoxy resins.

[7] The anisotropic conductive bonding member according to any one of [1] to [6], in which the pressure sensitive adhesive layer contains a migration prevention material.

[8] The anisotropic conductive bonding member according to any one of [1] to [7], in which an interval between the respective conductive paths is 5 nm to 800 nm.

[9] The anisotropic conductive bonding member according to any one of [1] to [8], in which the pressure sensitive adhesive layer contains an inorganic filler, and an average particle diameter of the inorganic filler is larger than the interval between the respective conductive paths.

[10] The anisotropic conductive bonding member according to any one of [1] to [9], in which the pressure sensitive adhesive layer contains a curing agent which is a liquid at 25° C.

[11] The anisotropic conductive bonding member according to any one of [1] to [10], in which the pressure sensitive adhesive layer has an oxidation prevention layer containing more than 50% by mass of the antioxidant material, and a polymer layer containing more than 50% by mass of the polymer material, and the oxidation prevention layer and the polymer layer are provided in this order from a side close to the surface of the insulating base.

[12] The anisotropic conductive bonding member according to any one of [1] to [11], in which in the pressure sensitive adhesive layer, the antioxidant material is eccentrically located on a side close to an interface between the protrusion of each of the conductive paths and the pressure sensitive adhesive layer.

[13] A semiconductor device comprising:

the anisotropic conductive bonding member according to any one of [1] to [12]; and a wiring substrate which is electrically connected to the conductive paths of the anisotropic conductive bonding member through an electrode and is laminated with the anisotropic conductive bonding member.

[14] A semiconductor package using the semiconductor device according to [13].

[15] A semiconductor device production method for preparing a semiconductor device including the anisotropic conductive bonding member according to any one of [1] to [12], and a wiring substrate having a plurality of electrodes, the method comprising, in order:

a temporary bonding process of bonding the anisotropic conductive bonding member and the wiring substrate by the pressure sensitive adhesive layer of the anisotropic conductive bonding member;

a main bonding process of electrically bonding conductive paths of the anisotropic conductive bonding member and the electrodes of the wiring substrate; and a pressure sensitive adhesive layer curing process of curing the pressure sensitive adhesive layer of the anisotropic conductive bonding member.

[16] The semiconductor device production method according to [15], in which temperature in the main bonding process is higher than temperature in the temporary bonding process.

[17] The semiconductor device production method according to [15] or [16], in which temperature in the pressure sensitive adhesive layer curing process is equal to or higher than temperature in the main bonding process.

[18] The semiconductor device production method according to any one of [15] to [17], further comprising:

a resin filling process of filling a gap between the plurality of electrodes of the wiring substrate with an insulating resin before the temporary bonding process.

[19] The semiconductor device production method according to any one of [15] to [18], further comprising:

an underfill material filling process of filling a gap between the anisotropic conductive bonding member and the wiring substrate with an underfill material after the pressure sensitive adhesive layer curing process.

As described below, according to the present invention, it is possible to provide an anisotropic conductive bonding member capable of achieving excellent conduction reliability and insulation reliability, a semiconductor device using the same, a semiconductor package, and a semiconductor device production method.

BRIEF DESCRIPTION OF THE DRAWINGS

FIG. 3E is a cross-sectional view in a case where the semiconductor chip, the anisotropic conductive bonding member, and the wiring substrate are mainly bonded out of the schematic cross-sectional views for illustrating the other example of the semiconductor device production method of the present invention.

FIG. 3F is a cross-sectional view in a case where a pressure sensitive adhesive layer is cured after the semiconductor chip, the anisotropic conductive bonding member, and the wiring substrate are mainly bonded out of the schematic cross-sectional views for illustrating the other example of the semiconductor device production method of the present invention.

FIG. 4A is a cross-sectional view before temporary bonding of an anisotropic conductive bonding member and a wiring substrate out of schematic cross-sectional views for illustrating a bonding process of the anisotropic conductive bonding member of the present invention.

DESCRIPTION OF THE PREFERRED EMBODIMENTS

Hereinafter, the present invention will be described in detail.

The description of the constitution requirements to be described below is made on the basis of representative embodiments of the present invention, but the present invention is not limited to these embodiments.

The numerical range represented by the term "to" in the specification includes the numerical values set forth before and after "to" as lower and upper limits, respectively.

[Anisotropic Conductive Bonding Member]

An anisotropic conductive bonding member of the present invention includes an insulating base made of an inorganic material, a plurality of conductive paths which are made of a conductive member, penetrate the insulating base in a thickness direction thereof and are provided in a mutually insulated state, and a pressure sensitive adhesive layer which is provided on a surface of the insulating base.

Each of the conductive paths has a protrusion protruding from the surface of the insulating base and the protrusion of each of the conductive paths is buried in the pressure sensitive adhesive layer.

In addition, the pressure sensitive adhesive layer contains an antioxidant material and a polymer material.

In the anisotropic conductive bonding member of the present invention, since an antioxidant material and a polymer material are incorporated in the pressure sensitive adhesive layer provided on the surface of the insulating base and the protrusions of the conductive paths protruding from the insulating base are buried in the pressure sensitive adhesive layer as described above, excellent conduction reliability and insulation reliability can be achieved.

Although the details are not clear, this is assumed as follows.

That is, it is considered that since tackiness is improved in a case where the electrodes of a wiring substrate or semiconductor chip and the anisotropic conductive bonding member are temporarily bonded, bonding accuracy is improved, oxidation of the conductive paths and the electrodes bonded to the conductive paths is prevented, and thus conduction reliability is improved.

In addition, it is considered that since the pressure sensitive adhesive layer is cured after the electrodes of the wiring substrate or semiconductor chip and the anisotropic conductive bonding member are mainly bonded, insulation reliability is improved.

Next, the configuration of the anisotropic conductive bonding member of the present invention will be described using FIGS. 1A and 1B.

Figure 1A:
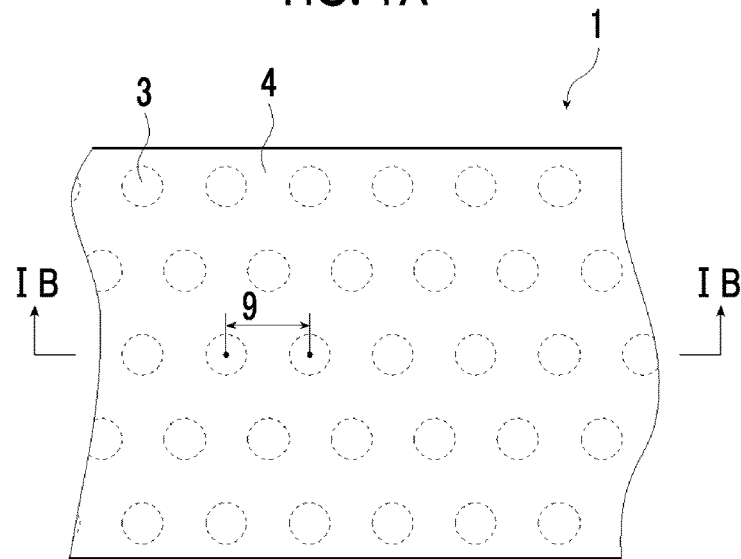
FIG. 1A is a front view of a schematic view showing an example of a preferable embodiment of an anisotropic conductive bonding member of the present invention.
Figure 1B:
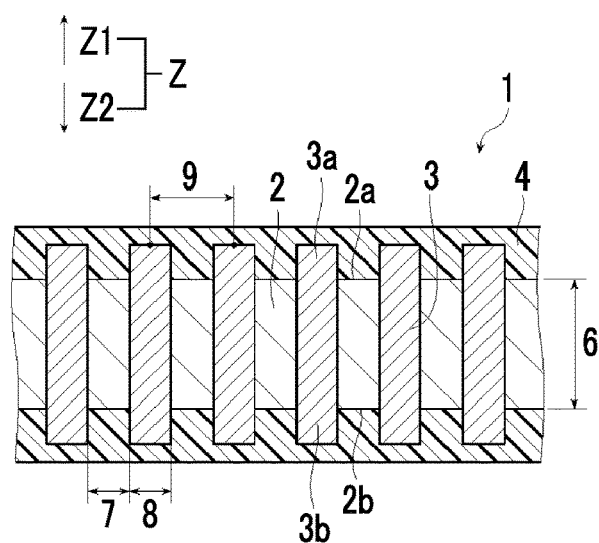
FIG. 1B is a cross-sectional view as viewed from a cutting line IB-IB in FIG. 1A.

An anisotropic conductive bonding member 1 shown in FIGS. 1A and 1B includes an insulating base 2, a plurality of conductive paths 3 made of a conductive member, and a pressure sensitive adhesive layer 4 provided on surfaces 2a and 2b of the insulating base 2.

In addition, the conductive paths 3 are provided to penetrate the insulating base 2 in a thickness direction Z (Z1: a direction from the rear surface to the front surface in FIG. 1A, Z2: a direction from the front surface to the rear surface in FIG. 1A) in a state in which the conductive paths are mutually insulated as shown in FIGS. 1A and 1B.

Further, as shown in FIG. 1B, the conductive paths 3 has protrusions 3a and 3b which protrude from the surfaces 2a and 2b of the insulating base 2, and the ends of the protrusions 3a and 3b are buried in the pressure sensitive adhesive layer 4.

Here, the term "mutually insulated state" means a state in which each conductive path present inside (in the thickness direction) the insulating base is mutually insulated inside the insulating base.

In addition, in FIG. 1B, the aspect having the pressure sensitive adhesive layer 4 on surfaces 2a and 2b of the insulating base 2 is shown, but in the present invention, the pressure sensitive adhesive layer may be provided on at least one surface of the insulating base.

Similarly, in FIG. 1B, the aspect in which the both ends of the conductive path 3 have the protrusions (reference numerals 3a and 3b) is shown, but in the present invention, the conductive path may have a protrusion protruding from the surface of the insulating base at least having the pressure sensitive adhesive layer (the surface of the insulating base).

Next, the materials and sizes of the insulating base, the conductive paths, and the pressure sensitive adhesive layer of the anisotropic conductive bonding member of the present invention and the forming methods thereof will be described.

[Insulating Base]

The insulating base constituting the anisotropic conductive bonding member of the present invention is made of an inorganic material and is not particularly limited as long as the insulating base may be an insulating base having substantially the same electrical resistivity (about $10^{14}$ Ω·cm) as that of an insulating base constituting a conventionally known anisotropic conductive film or the like.

The "made of an inorganic material" is a definition to distinguish the material of the insulating base from a polymer material constituting the pressure sensitive adhesive layer, which will be described later, and is not limited to an insulating base made of only an inorganic material but refers to an insulating base having an inorganic material as a main component (50% by mass or more).

Examples of the insulating base include a metal oxide base, a metal nitride base, a glass base, a ceramic base (for example, silicon carbide, and silicon nitride), a carbon base (for example, diamond-like carbon), a polyimide base, and a composite material of these, and the insulating base may be a material of a film of an inorganic material including 50% by mass or more of a ceramic material and a carbon material that is formed on an organic material having through-holes.

In the present invention, the insulating base is preferably a metal oxide base and more preferably an anodized film of a valve metal for the reason that micropores having a desired average opening diameter are formed as through-holes and thus conductive paths, which will be described later, are easily formed.

Here, specific examples of the valve metal include aluminum, tantalum, niobium, titanium, hafnium, zirconium, zinc, tungsten, bismuth, and antimony.

Among these, an anodized film (base) of aluminum is preferably used because aluminum has a good dimensional stability and is relatively inexpensive.

In the present invention, the thickness of the insulating base (a portion indicated by the reference numeral 6 in FIG. 1B) is preferably 1 μm to 1,000 μm, more preferably 5 μm to 500 μm, and still more preferably 10 μm to 300 μm. In a case where the thickness of the insulating base is within this range, the handleability of the insulating base becomes satisfactory.

Here, the thickness of the insulating base refers to an average value of thicknesses measured at 10 points by observing the cross section of the anisotropic conductive bonding member with a field emission scanning electron microscope.

In the present invention, the interval between the respective conductive paths in the insulating base is preferably 5 nm to 800 nm, more preferably 10 nm to 200 nm, and still more preferably 20 nm to 60 nm. In a case where the interval between the respective conductive paths in the insulating base is within this range, the insulating base sufficiently functions as an insulating partition wall.

Here, the interval between the respective conductive paths refers to a width between adjacent conductive paths (a portion that is indicated by the reference numeral 7 in FIG. 1B) and also refers to an average value of widths between adjacent conductive paths measured at 10 points by observing the cross section of the anisotropic conductive bonding member with a field emission scanning electron microscope at a magnification of 200,000 times.

[Conductive Path]

The plurality of conductive paths constituting the anisotropic conductive bonding member of the present invention are conductive paths which are made of a conductive member, penetrate the insulating base in the thickness direction, and are provided in a mutually insulated state.

In addition, the conductive paths have protrusions protruding from the surface of the insulating base and ends of the protrusions of each conductive paths are buried in the pressure sensitive adhesive layer described later.

<Conductive Member>

The conductive member constituting the conductive paths is not particularly limited as long as the material has an electrical resistivity of $10^3$ Ω·cm or less. Specific preferable examples of the material include gold (Au), silver (Ag), copper (Cu), aluminum (Al), magnesium (Mg), nickel (Ni), and tin oxide doped with indium (ITO).

Among these, from the viewpoint of electrical conductivity, copper, gold, aluminum, and nickel are preferable, and copper and gold are more preferable.

<Protrusion>

The protrusions of the conductive paths are portions of the conductive paths that protrude from the surface of the insulating base and the ends of the protrusions are buried in the pressure sensitive adhesive layer.

In the present invention, when the anisotropic conductive bonding member is connected (bonded) to the electrode by means of compression or the like, from the reason that insulating properties in the plane direction in the case where protrusions are collapsed can be sufficiently secured, the aspect ratio of the protrusion of the conductive path (height of protrusion/diameter of protrusion) is preferably 0.5 or more and less than 50, more preferably 0.8 to 20, and still more preferably 1 to 10.

In addition, in the present invention, from the viewpoint of following the surface shape of a semiconductor chip or a wiring substrate which is an object to be connected, the height of the protrusion of the conductive path is preferably 50 nm to 3,000 nm, more preferably 100 to 2,000 nm, and still more preferably 200 to 1,000 nm.

Similarly, the diameter of the protrusion of the conductive path is preferably more than 5 nm and 10 µm or less and more preferably 20 nm to 1,000 nm.

Here, the height of the protrusion of the conductive path refers to an average value of heights of the protrusions of the conductive paths measured at 10 points by observing the cross section of the anisotropic conductive bonding member with a field emission scanning electron microscope at a magnification of 20,000 times.

Similarly, the diameter of the protrusion of the conductive path refers to an average value of diameters of the protrusions of the conductive paths measured at 10 points by observing the cross section of the anisotropic conductive bonding member with a field emission scanning electron microscope.

<Other Shapes>

The conductive path has a columnar shape and the diameter thereof (a portion that is indicated by the reference numeral 8 in FIG. 1B) is preferably more than 5 nm and 10 µm or less and more preferably 20 nm to 1,000 nm, similar to the diameter of the protrusion.

In addition, the conductive paths are presented in a state in which the conductive paths are mutually insulated from each other by the insulating base. The density thereof is preferably 20,000 conductive paths/mm$^2$ or more, more preferably 2,000,000 conductive paths/mm$^2$ or more, still more preferably 10,000,000 conductive paths/mm$^2$ or more, particularly preferably 50,000,000 conductive paths/mm$^2$ or more, and most preferably 100,000,000 conductive paths/mm$^2$ or more.

Further, the center-to-center distance between adjacent each conductive path (a portion indicated by the reference numeral 9 in FIGS. 1A and 1B) is preferably 20 nm to 500 nm, more preferably 40 nm to 200 nm, and still more preferably 50 nm to 140 nm.

[Pressure Sensitive Adhesive Layer]

The pressure sensitive adhesive layer constituting the anisotropic conductive bonding member of the present invention is provided on the surface of the insulating base and is provided for burying the above-described conductive paths therein. That is, the pressure sensitive adhesive layer covers the surface of the insulating base and end portions of the conductive paths protruding from the insulating base.

In the present invention, the pressure sensitive adhesive contains an antioxidant material and a polymer material.

<Antioxidant Material>

Specific examples of the antioxidant material contained in the pressure sensitive adhesive layer include imidazole, 2-methylimidazole, 2-ethylimidazole, 2-propyl imidazole, 2-undecylimidazole, 2-heptadecylimidazole, 5-methylbenzimidazole, polyvinylimidazole, 1,2,3,4-tetrazole, 5-amino-1,2,3,4-tetrazole, 5-methyl-1,2,3,4-tetrazole, 1H-tetrazole-5-acetic acid, 1H-tetrazol-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3-amino-1,2,4-triazole-5-carboxylic acid, 3-amino-5-mercapto-1,2,4-triazole, 3-amino-5-methyl-1,2,4-triazole, 3-amino-5-ethyl-1,2,4-triazole, 1H-1,2,4-triazole-3-thiol, 3,5-diamino-1,2,4-triazole, 3-carboxy-1,2,4-triazole, 3,5-dicarboxy-1,2,4-triazole, 1,2,4-triazole-3-acetic acid, 1H-benzotriazole, 1H-benzotriazole-5-carboxylic acid, 2-benzothiazolethiol, 5-phenyl-1H-tetrazole, 5-methyl-1H-benzotriazole, benzofuroxane, 2,1,3-benzothiazole, o-phenylenediamine, m-phenylenediamine, catechol, o-aminophenol, 2-mercapto benzothiazole, 2-mercaptobenzimidazole, 2-mercaptobenzoxazole, melamine, thiomalic acid, IRGAMET39, IRGAMET42, polyvinylpyrrolidone, tetrazine, phenylthiourea, naphthylamine, polyethyleneimine, polyallylamine, and derivatives thereof.

Among these, benzotriazole and a derivative thereof are preferable.

Examples of the benzotriazole derivative include substituted benzotriazoles having a benzene ring of benzotriazole substituted with a hydroxyl group, an alkoxy group (for example, methoxy group or ethoxy group), an amino group, a nitro group, an alkyl group (for example, methyl group, ethyl group, or butyl group), a halogen atom (for example, fluorine, chlorine, bromine, or iodine), and the like. Further, naphthalenetriazole and naphthalenebistriazole, as well as substituted naphthalenetriazoles and substituted naphthalenebistriazole substituted as described above may be used.

Other examples of the antioxidant material contained in the pressure sensitive adhesive layer include higher fatty acids, higher fatty acid copper, phenol-based antioxidants such as phenolic compounds, alkanolamines, quinone-based antioxidants such as hydroquinones, copper chelating agents, amine-based antioxidants such as organic amines, sulfur-based antioxidants such as organic ammonium salts, and phosphorus-based antioxidants, which are common antioxidants.

Specific examples of the phenol-based antioxidants include p-methoxyphenol, 2,6-di-tert-butyl-4-methyl phenol, Irganox 1010, Irganox 1330, Irganox 3114, and Irganox 1035 (all manufactured by BASF SE), and Sumilizer MDP-S and Sumilizer GA-80 (all manufactured by Sumitomo Chemical Co., Ltd.).

Specific examples of the sulfur-based antioxidants include distearyl 3,3'-thiodipropionate, and Sumilizer TPM, Sumilizer TPS, and Sumilizer TP-D (all manufactured by Sumitomo Chemical Co., Ltd.).

Specific examples of phosphorus-based antioxidants include tris(2,4-di-tert-butylphenyl)phosphite, bis(2,4-di-tert-butylphenyl)pentaerythritol diphosphite, poly(dipropylene glycol)phenyl phosphite, diphenylisodecyl phosphite, 2-ethylhexyl diphenyl phosphite, triphenyl phosphite, and Irgafos 168 and Irgafos 38 (all manufactured by BASF SE).

Specific examples of the quinone-based antioxidants include p-benzoquinone and 2-tert-butyl-1,4-benzoquinone.

Specific examples of the amine-based antioxidants include dimethylaniline and phenothiazine.

In the present invention, only one antioxidant may be used or two or more antioxidants may be used in combination.

Among these antioxidants, a phenol-based antioxidant and a sulfur-based antioxidant or phosphorus-based antioxidant are preferably used in combination and a phenol-based antioxidant and a sulfur-based antioxidant are most preferably used in combination.

By performing the above combination, the effect of effectively suppressing deterioration of the pressure sensitive adhesive layer due to oxidation reaction can be expected.

In the present invention, the content of the antioxidant material contained in the pressure sensitive adhesive layer is not particularly limited but from the viewpoint of the anticorrosive effect, the content of the antioxidant material is preferably 0.0001% by mass or more and more preferably 0.001% by mass or more with respect of the total mass of the pressure sensitive adhesive layer. In addition, for the reason of obtaining an appropriate electric resistance in the main bonding process, the content thereof is preferably 5.0% by mass or less and more preferably 2.5% by mass or less.

In the present invention, from the viewpoint of further improving conduction reliability and insulation reliability, it is preferable that the antioxidant material contained in the pressure sensitive adhesive layer is eccentrically located on a side close to the interface between the protrusions of the conductive paths and the pressure sensitive adhesive layer.

Here, the expression "eccentrically located on a side close to the interface between the protrusion of each of the conductive paths and the pressure sensitive adhesive layer" means that the concentration of the antioxidant material at the interface between the protrusion of each of the conductive paths and the pressure sensitive adhesive layer is higher than the average concentration of the antioxidant material in the pressure sensitive adhesive layer.

Figure 1C:
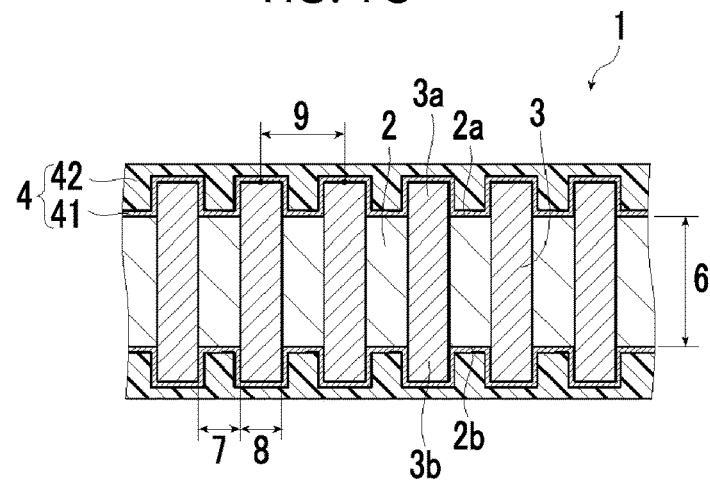
FIG. 1C is a schematic cross-sectional view showing another example of a preferable embodiment of the anisotropic conductive bonding member of the present invention.

As a method of eccentrically locating the antioxidant material contained in the pressure sensitive adhesive layer on the side close to the interface between the protrusion of each of the conductive paths and the pressure sensitive adhesive layer, for example, as shown in FIG. 1C, a method in which a first pressure sensitive adhesive layer 41 containing an antioxidant material is formed on the surfaces 2a and 2b of the insulating base and surfaces 3a and 3b of the protrusion of each of the conductive paths and then a second pressure sensitive adhesive layer 42 containing no antioxidant material or containing an antioxidant material in an amount smaller than the amount of the antioxidant material contained in the first pressure sensitive adhesive layer 41 is formed on the first pressure sensitive adhesive layer 41, and the like may be used.

Here, the thickness of the first pressure sensitive adhesive layer is preferably 2 nm to 200 nm.

In addition, the total thickness of the first pressure sensitive adhesive layer and the second pressure sensitive adhesive layer is preferably 50 nm to 1,500 nm and more preferably 250 nm to 1,000 nm.

Further, the antioxidant material contained in the first pressure sensitive adhesive layer and the antioxidant material that may be contained in the second pressure sensitive adhesive layer in a small amount may be different from each other but are preferably the same.

The content of the antioxidant material contained in the first pressure sensitive adhesive layer is preferably 0.01% by mass or more and more preferably 0.1% by mass or more with respect to the total mass of the first pressure sensitive adhesive layer. For the reason of obtaining an appropriate electric resistance in the main bonding process, the content thereof is preferably 5.0% by mass or less and more preferably 2.5% by mass or less.

The content of the antioxidant material that may be contained in the second pressure sensitive adhesive layer in a small amount is preferably 0.1 times or less and more preferably 0.01 times or less the mass of the antioxidant material contained in the first pressure sensitive adhesive layer. For the reason of obtaining an appropriate electric resistance in the main bonding process, the total content of the antioxidant material obtained by adding the amount of the antioxidant material in each layer preferably 5.0% by mass or less and more preferably 2.5% by mass or less with respect to the total mass of the pressure sensitive adhesive layer.

<Polymer Material>

The polymer material contained in the pressure sensitive adhesive layer is not particularly limited but for the reason that the gap between a wiring substrate or a semiconductor chip and the anisotropic conductive bonding member can be effectively filled and adhesiveness with the wiring substrate is further improved, a thermosetting resin is preferable.

Specific examples of the thermosetting resin include epoxy resins, phenolic resins, polyimide resins, polyester resins, polyurethane resins, bismaleimide resins, melamine resins, isocyanate-based resins, acrylic resins, and phenoxy resins. These may be used singly or in combination of two or more thereof.

Among them, for the reason of further improving insulation reliability and obtaining excellent chemical resistance, it is preferable to use a polyimide resin and/or an epoxy resin.

<Migration Prevention Material>

The pressure sensitive adhesive layer constituting the anisotropic conductive bonding member of the present invention preferably contains a migration prevention material for the reason that insulation reliability is further improved by trapping metal ions or halogen ions that may be contained in the pressure sensitive adhesive layer and metal ions derived from the conductive paths in a case of using the anisotropic conductive bonding member for a semiconductor device or electrodes of a wiring substrate.

As the migration prevention material, for example, an ion exchanger, specifically, a mixture of cation exchanger and anion exchanger, or only a cation exchanger can be used.

Here, the cation exchanger and the anion exchanger can be respectively appropriately selected from inorganic ion exchangers and organic ion exchangers described later.

(Inorganic Ion Exchanger)

Examples of inorganic ion exchangers include hydrated oxides of metals typified by hydrous zirconium oxide.

As the kind of metal, for example, in addition to zirconium, iron, aluminum, tin, titanium, ammonium, magnesium, beryllium, indium, chromium, bismuth, and the like are known.

Among these, the zirconium-based exchanger has an exchange capacity for cations $Cu^{2+}$ and $Al^{3+}$. In addition, the iron-based exchanger also has an exchange capacity for $Ag^+$ and $Cu^{2+}$. Similarly, the tin-based, titanium-based, and antimony-based exchangers are cation exchangers.

On the other hand, the bismuth-based exchanger has an exchange capacity for an anion $Cl^-$.

Further, the zirconium-based exchanger exhibits an anion exchange capacity depending on the production conditions. The same is applied to the aluminum-based and tin-based exchangers.

As inorganic ion exchangers other than the above examples, acid salts of polyvalent metals typified by zirconium phosphate, heteropolyacid salts typified by ammonium molybdophosphate, and synthetic products such as insoluble ferrocyanide are known.

Some of these inorganic ion exchangers are already commercially available, and for example, various grades are known in the trade name "IXE" series of Toagosei Co., Ltd.

In the present invention, in addition to the above synthetic products, powders of inorganic ion exchangers of natural substances such as zeolites and montmorillonite can also be used.

(Organic Ion Exchanger)

Examples of organic ion exchangers include a crosslinked polystyrene having a sulfonic acid group as a cation exchanger and in addition to the above crosslinked polystyrene, crosslinked polystyrenes having a carboxylic acid group, a phosphonic acid group, and a phosphinic acid group may be used.

Other examples thereof include crosslinked polystyrenes having a quaternary ammonium group, a quaternary phosphonium group and a tertiary sulfonium group as an anion exchanger.

These inorganic ion exchangers and organic ion exchangers may be appropriately selected in consideration of cations to be trapped, the kind of anion, and an ion exchange capacity thereof. Of course, it is needless to say that an inorganic ion exchanger and an organic ion exchanger may be used as a mixture.

In the present invention, since a step of preparing a semiconductor device includes a heating process, an inorganic ion exchanger is preferable.

Regarding the mixing ration of the ion exchanger and the above-described polymer material, for example, from the viewpoint of mechanical strength, the amount of the ion exchanger is preferably 10% by mass or less, more preferably 5% by mass or less, and still more preferably 2.5% by mass or less. From the viewpoint of suppressing migration in a case where a wiring substrate and the anisotropic conductive bonding member are bonded, the amount of the ion exchanger is preferably 0.01% by mass or more.

<Inorganic Filler>

The pressure sensitive adhesive layer constituting the anisotropic conductive bonding member of the present invention preferably contains an inorganic filler.

The inorganic filler is not particularly limited and can be appropriately selected from known inorganic fillers. Examples thereof include kaolin, barium sulfate, barium titanate, silicon oxide powder, silicon oxide fine powder, silica produced by a gas phase method, indefinitely shaped silica, crystalline silica, molten silica, spherically shaped silica, talc, clay, magnesium carbonate, calcium carbonate, aluminum oxide, aluminum hydroxide, mica, aluminum nitride, zirconium oxide, yttrium oxide, silicon carbide, and silicon nitride.

In the present invention, for the reason of preventing the inorganic filler from entering between the conductive paths and further improving conduction reliability, the average particle diameter of the inorganic filler is preferably larger than the interval between the conductive paths.

The average particle diameter of the inorganic filler is preferably 30 nm to 10 µm and more preferably 80 nm to 1 µm.

Here, the average particle diameter is an average particle diameter of primary particle diameters measured with a laser diffraction and scattering type particle diameter measuring apparatus (MICROTRAC MT3300 manufactured by Nikkiso Co., Ltd.).

<Curing Agent>

The pressure sensitive adhesive layer constituting the anisotropic conductive bonding member of the present invention may contain a curing agent.

In a case where the pressure sensitive adhesive layer contains a curing agent, from the viewpoint of suppressing defective bonding with a semiconductor chip or a wiring substrate which is an object to be connected, instead of using a curing agent which is a solid at normal temperature, a curing agent which is a liquid at normal temperature is preferably incorporated in the pressure sensitive adhesive layer.

Here, the term "solid at normal temperature" refers to being a solid at 25° C. and for example, refers to a substance having a melting point higher than 25° C.

Specific examples of the curing agent include aromatic amine-based curing agents such as diaminodiphenylmethane and diaminodiphenylsulfone, aliphatic amine-based curing agents such as triethylenetetramine and menthenediamine, modified amine-based curing agents such as amine adduct and ketamine, tertiary or secondary amine-based curing agents such as polyamide resin, benzyldimethylamine, and 2,4,6-tris(dimethylaminomethyl)phenol, boron trifluoride-amine complexes, sulfonium salts, amine imides, polyamine salts, imidazole-based curing agents such as 4-methylimidazole, dicyandiamide-based curing agents such as dicyandiamide, tetramethylguanidines, thiourea added amines, acid anhydride-based curing agents such as methyl hexahydrophthalic acid anhydride, hydrazide-based curing agents such as 7,11-octadecadiene-1,18-dicarbohydrazide, carboxylic acid amides, polyphenol compounds, novolak resins, polymercaptans, NOVACURE (trade name, manufactured by Asahi Kasei Chemicals Corporation) as a curing agent including an epoxy resin and an amine compound, and UV curable curing agents. Among these curing agents, a curing agent which is a liquid at 25° C. can be appropriately selected. The curing agents may be used singly or in combination of two or more thereof.

A curing agent capable of stably storing a pressure sensitive adhesive layer in which a curing agent is formulated at room temperature and rapidly curing the pressure sensitive adhesive layer by heat, light, pressure, or the like, such as a dicyandiamide-based curing agent, hydrazide-based curing agent, boron trifluoride-amine complex, sulfonium salt, amine imide, or polyamine salt, is commonly called a latent curing agent. In the present invention, particularly, in a case of using the curing agent in bonding for a short period of time for speeding up the tact time, a latent curing agent is preferably used.

In the present invention, the pressure sensitive adhesive layer may contain various additives, which are generally widely added to a resin insulation film of a semiconductor package within a range not deteriorating the properties thereof, such as a dispersing agent, a buffer agent, a viscosity adjuster, a polymerization initiator, a polymerization inhibitor, a silane coupling agent, and a pH adjuster.

<Shape>

The shape of the pressure sensitive adhesive layer is not particularly limited but from the viewpoint of following the surface shape of a semiconductor chip or a wiring substrate which is an object to be connected, the thickness of the pressure sensitive adhesive layer is preferably 50 nm to 1,500 nm and more preferably 250 nm to 1,000 nm.

Here, the thickness of the pressure sensitive adhesive layer refers to a height from the surface of the insulating base (the surface indicated by the reference numeral 2a or 2b in FIG. 1B) in a vertical direction and refers to an average value of thicknesses measured at 10 points by observing the cross section of the anisotropic conductive bonding member with a field emission scanning electron microscope.

The pressure sensitive adhesive layer may be constituted by two or more layers and one layer and another layer may have different components.

Figure 1D:
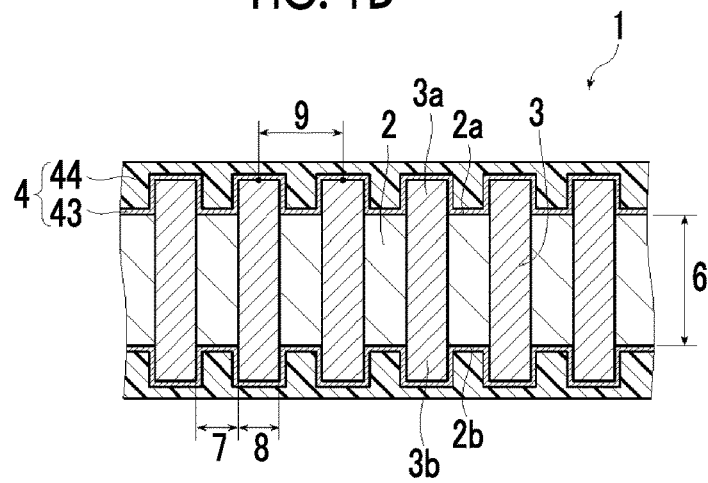
FIG. 1D is a schematic cross-sectional view showing still another example of a preferable embodiment of the anisotropic conductive bonding member of the present invention.

As an aspect of such a pressure sensitive adhesive layer, for example, as shown in FIG. 1D, an aspect separately having an oxidation prevention layer 43 containing more than 50% by mass of the above-described antioxidant material and a polymer layer 44 containing more than 50% by mass of the above-described polymer material is suitably adopted.

Here, the expression "containing more than 50% by mass of the above-described antioxidant material" refers to the antioxidant material being contained at more than 50% by mass of the total mass of a solid content constituting the oxidation prevention layer and the content of the antioxidant material is preferably 60% to 100% by mass and more preferably 80% to 100% by mass. It is preferable that the oxidation prevention layer does not contain the polymer material.

The expression "containing more than 50% by mass of the above-described polymer material" refers to the polymer material being contained at more than 50% by mass of the total mass of a solid content constituting the polymer layer and the content of the polymer material is preferably 60% to 100% by mass and more preferably 70% to 100% by mass. It is preferable that the polymer layer does not contain the antioxidant material.

In a case where the oxidation prevention layer and the polymer layer are provided as a pressure sensitive adhesive layer, for the reason of further improving conduction reliability and insulation reliability, the oxidation prevention layer and the polymer layer are preferably provided in this order from a side close to the surface of the insulating base.

In addition, the thickness of the oxidation prevention layer is preferably 0.1 nm to 50 nm.

Further, the total thickness of the oxidation prevention layer and the polymer layer, that is, the thickness of the pressure sensitive adhesive layer is preferably 50 nm to 1,500 nm and more preferably 250 nm to 1,000 nm as described above.

The method of forming the oxidation prevention layer is not particularly limited but for example, a method of immersing the insulating base from which the conductive paths protrude in a solution obtained by dissolving the antioxidant material in a solvent may be used.

At this time, the temperature is preferably lower than the melting point of the solvent and preferably higher than room temperature (23° C.) and more preferably higher than 40° C.

The solvent is not particularly limited as long as the solvent dissolves the antioxidant material and for example, water, alcohol, and ketone-based, ether-based, and oil-based solvents can be used.

In the present invention, for the reason of protecting the conductive paths of the anisotropic conductive bonding member, the thickness of the pressure sensitive adhesive layer is larger than the height of the protrusion of each of the conductive paths and is preferably 100 μm or less and more preferably 100 nm to 10 μm.

In addition, in the present invention, for the reason of reducing the connection resistance of the anisotropic conductive bonding member and the electrode, a difference between the height of the protrusion of each of the conductive paths and the thickness of the pressure sensitive adhesive layer is preferably 1 nm to 99.95 μm and more preferably 10 nm to 10 μm.

[Anisotropic Conductive Bonding Member Production Method]

The anisotropic conductive bonding member production method of the present invention (hereinafter, formally also referred to as "production method of the present invention") is not particularly limited. For example, the production method includes a conductive path forming step of forming conductive paths by filling the through-holes provided in the insulating base with the conductive material, a trimming step of removing only a part of the surface of the insulating base after the conductive path forming step and causing the conductive paths to protrude, and a pressure sensitive adhesive layer forming step of forming a pressure sensitive adhesive layer on the surface of the insulating base and the protrusion of each of the conductive paths after the trimming step.

[Preparation of Insulating Base]

For the insulating base, for example, a glass substrate having through-holes (Through Glass Via: TGV) can be used as it is. However, from the viewpoint of controlling the opening diameter of the conductive path and the aspect ratio of the protrusion to be within the above-described ranges, a method of subjecting a valve metal to an anodizing treatment is preferable.

As the anodizing treatment, for example, in the case where the insulating base is an anodized film of aluminum, an anodizing treatment of anodizing an aluminum substrate is carried out and then a penetration treatment of penetrating the substrate to form holes of micropores formed by the anodization after the anodizing treatment is carried out sequentially to prepare an insulating base.

In the present invention, regarding the aluminum substrate used for the preparation of the insulating base and each of the treatment steps to be carried out on the aluminum substrate, the same aluminum substrates and treatment steps as in the description of paragraphs [0041] to [0121] of JP2008-270158A can be adopted.

[Conductive Path Forming Step]

The conductive path forming step is a step of filling the through-holes that are provided in the insulating base with the conductive material.

Here, examples of the method of filling the through-holes with a metal include the same methods as each method (electrolytic plating method or electroless plating method) described in paragraphs [0123] to [0126] and [FIG. 4] of JP2008-270158A.

In addition, in an electrolytic plating method or an electroless plating method, it is preferable to provide an electrode layer made of gold, nickel, copper or the like in advance. As the method of forming the electrode layer, for example, a vapor phase treatment by sputtering or the like; a liquid phase treatment such as electroless plating or the like; a combination of these treatments; and the like may be used.

Through the metal filling step, an anisotropic conductive bonding member before the protrusions of the conductive paths are formed is obtained.

On the other hand, instead of using the methods described in JP2008-270158A, for example, the conductive path forming step may be a method having an anodizing treatment step of forming an anodized film having micropores present in the thickness direction and a barrier layer present at the bottom of the micropores on one surface of an aluminum substrate by subjecting one surface of the aluminum substrate (hereinafter, also referred to as "one surface") to an anodizing treatment, a barrier layer removal step of removing the barrier layer of the anodized film after the anodizing treatment step, a metal filling step of filling the micropores with a metal by subjecting the anodized film to an electrolytic plating treatment after the barrier layer removal step, and a substrate removal step of obtaining a metal-filled microstructure by removing the aluminum substrate after the metal filling step.

<Anodizing Treatment Step>

The anodizing step is a step of forming an anodized film having micropores present in the thickness direction and a barrier layer present at the bottom of the micropores on one surface of the aluminum substrate by subjecting one surface of the aluminum substrate to an anodizing treatment.

In the production method of the present invention, the anodizing treatment can be carried out using conventionally known methods but from the viewpoint of increasing regularity of micropore arrangement and securing anisotropic conductivity, a self-regulation method and a constant voltage treatment are preferably used.

Here, regarding the self-regulation method and the constant voltage treatment of the anodizing treatment, the same treatments as each of the treatments described in paragraphs [0056] to [0108] and [FIG. 3] of JP2008-270158A can be carried out.

<Barrier Layer Removal Step>

The barrier layer removal step is a step of removing the barrier layer of the anodized film after the anodizing treatment step. By removing the barrier layer, a part of the aluminum substrate is exposed through the micropores.

The method of removing the barrier layer is not particularly limited and examples thereof include a method of electrochemically dissolving the barrier layer at a potential lower than the potential in the anodizing treatment of the anodizing treatment step (hereinafter, also referred to as an "electrolytic removal treatment"); a method of removing the barrier layer by etching (hereinafter, also referred to as an "etching removal treatment"); and a method of combining these methods (particularly, a method of removing the barrier layer remaining after the electrolytic removal treatment is carried out by the etching removal treatment).

<Electrolytic Removal Treatment>

The electrolytic removal treatment is not particularly limited as long as the electrolytic treatment is carried out at a potential lower than the potential in the anodizing treatment of the anodizing treatment step (electrolytic potential).

In the present invention, the electrolytic removal treatment may be carried out continuously with the anodizing treatment by, for example, dropping the electrolytic potential when the anodizing treatment step is completed.

For the conditions for the electrolytic removal treatment other than electrolytic potential, the same electrolytic solutions and treatment conditions as in the above-described conventionally known anodizing treatments can be adopted.

Particularly, in the case where the electrolytic removal treatment and the anodizing treatment are continuously carried out as described above, it is preferable to carry out the treatments using the same electrolytic solution.

(Electrolytic Potential)

The electrolytic potential in the electrolytic removal treatment is preferably dropped to a potential lower than the electrolytic potential in the anodizing treatment continuously or stepwise.

The reduction range (step width) when the electrolytic potential is dropped stepwise is preferably 10 V or less, more preferably 5 V or less, and still more preferably 2 V or less from the viewpoint of the voltage resistance of the barrier layer.

In addition, the voltage dropping rate when the electrolytic potential is dropped continuously or stepwise is preferably 1 V/sec or less, more preferably 0.5 V/sec or less, and still more preferably 0.2 V/sec or less from the viewpoint of productivity.

<Etching Removal Treatment>

The etching removal treatment is not particularly limited and may be a chemical etching treatment for dissolution using an aqueous acid solution or an aqueous alkaline solution or may be a dry etching treatment.

(Chemical Etching Treatment)

The barrier layer by the chemical etching treatment may be removed by, for example, a method of immersing the structure after the anodizing treatment step in an aqueous acid solution or an aqueous alkaline solution, filling the micropores with the aqueous acid solution or the aqueous alkaline solution, and then bringing the surface of the anodized film on the opening side of the micropores into contact with a pH buffer solution or the like and only the barrier layer can be selectively dissolved.

Here, in the case of carrying out the treatment using an aqueous acid solution, it is preferable to use an aqueous solution of an inorganic acid such as sulfuric acid, phosphoric acid, nitric acid or hydrochloric acid, or a mixture thereof. The aqueous acid solution preferably has a concentration of 1% to 10% by mass. The temperature of the aqueous acid solution is preferably 15° C. to 80° C., more preferably 20° C. to 60° C., and still more preferably 30° C. to 50° C.

On the other hand, in the case of carrying out the treatment using an aqueous alkaline solution, it is preferable to use an aqueous solution of at least one alkali selected from the group consisting of sodium hydroxide, potassium hydroxide, and lithium hydroxide. In addition, the aqueous alkaline solution preferably has a concentration of 0.1% to 5% by mass. The temperature of the aqueous alkaline solution is preferably 10° C. to 60° C., more preferably 15° C. to 45° C., and still more preferably 20° C. to 35° C. The aqueous alkaline solution may contain zinc and other metals.

Specifically, for example, a 40° C. aqueous solution containing 50 g/L of phosphoric acid, a 30° C. aqueous solution containing 0.5 g/L of sodium hydroxide, a 30° C. aqueous solution containing 0.5 g/L of potassium hydroxide, or the like is suitably used.

As the pH buffer solution, a buffer solution suitable to the aqueous acid solution or aqueous alkaline solution can be suitably used.

In addition, the time of immersion in the aqueous acid solution or aqueous alkaline solution is preferably 8 to 120 minutes, more preferably 10 to 90 minutes, and still more preferably 15 to 60 minutes.

(Dry Etching Treatment)

In the dry etching treatment, it is preferable to use, for example, a gas such as a $Cl_2/Ar$ mixed gas.

<Metal Filling Step>

The metal filling step is a step of filling the micropores in the anodized film, which has been subjected to an electrolytic plating treatment, with a metal after the barrier layer removal step, and examples thereof include the same methods (an electrolytic plating method and an electroless plating method) as each method described in paragraphs [0123] to [0126] and [FIG. 4] of JP2008-270158A.

In the electrolytic plating method or the electroless plating method, the aluminum substrate that is exposed through the micropores after the above-described barrier layer removal step can be used as an electrode.

<Substrate Removal Step>

The substrate removal step is a step of obtaining a metal-filled microstructure by removing the aluminum substrate after the metal filling step.

As the method of removing the aluminum substrate, for example, a method of dissolving only the aluminum substrate using a treatment liquid without dissolving the metal filling the micropores in the metal filling step and the anodized film as the insulating base may be used.

Examples of the treatment liquid include aqueous solutions such as mercury chloride, a bromine/methanol mixture, a bromine/ethanol mixture, aqua regia, and a hydrochloric acid/copper chloride mixture. Among these, the treatment liquid is preferably a hydrochloric acid/copper chloride mixture.

In addition, the concentration of the treatment liquid is preferably 0.01 to 10 mol/L and more preferably 0.05 to 5 mol/L.

The treatment temperature is preferably −10° C. to 80° C. and more preferably 0° C. to 60° C.

[Trimming Step]

The trimming step is a step of removing only a part of the insulating base on the surface of the anisotropic conductive bonding member after the conductive path forming step and causing the conductive paths to protrude.

Here, the trimming treatment is not particularly limited as long as the metal constituting the conductive paths is not dissolved, and for example, in the case of carrying out the treatment using an aqueous acid solution, it is preferable to use an aqueous solution of an inorganic acid such as sulfuric acid, phosphoric acid, nitric acid, or hydrochloric acid, or a mixture thereof. Among these, it is preferable to use an aqueous solution not containing chromic acid from the viewpoint of excellent safety. The aqueous acid solution preferably has a concentration of 1% to 10% by mass. The temperature of the aqueous acid solution is preferably 25° C. to 60° C.

On the other hand, in the case of carrying out the treatment using an aqueous alkaline solution, it is preferable to use an aqueous solution of at least one alkali selected from the group consisting of sodium hydroxide, potassium hydroxide, and lithium hydroxide. The aqueous alkaline solution preferably has a concentration of 0.1% to 5% by mass. The temperature of the aqueous alkaline solution is preferably 20° C. to 50° C.

Specifically, for example, a 40° C. aqueous solution containing 50 g/L of phosphoric acid, a 30° C. aqueous solution containing 0.5 g/L of sodium hydroxide, or a 30° C. aqueous solution containing 0.5 g/L of potassium hydroxide is suitably used.

The time of immersion in the aqueous acid solution or aqueous alkaline solution is preferably 8 to 120 minutes, more preferably 10 to 90 minutes, and still more preferably 15 to 60 minutes. Here, in the case of repeating an immersion treatment for a short period of time (trimming treatment), the time of immersion is a total of each time of immersion. Incidentally, a washing treatment may be carried out between each immersion treatment.

In the production method of the present invention, in a case of strictly controlling the height of the protrusions of the conductive paths in the trimming step, it is preferable to process the insulating base and the ends of the conductive paths to form the same plane after the conductive path forming step, and then selectively remove (trim) the insulating base.

Here, for example, the method of processing to form the same plane include physical polishing (for example, free abrasive polishing, back grinding, polishing using a surface planer, or the like), electrochemical polishing, polishing of combining these polishing processes, and the like.

In addition, in the production method of the present invention, after the above-described conductive path forming step or trimming step, a heating treatment can be carried out in order to reduce the strain generated in the conductive paths by the filling of the metal.

It is preferable to carry out a heating treatment in a reducing atmosphere from the viewpoint of preventing oxidation of the metal. Specifically, a heating treatment is preferably carried out at an oxygen concentration of 20 Pa or less and more preferably carried out in vacuum. The term "vacuum" used herein refers to a state of a space with a gas density or pressure lower than the gas density or pressure of air.

In addition, it is preferable to carry out a heating treatment while applying pressure to a material for the purpose of correction.

[Pressure Sensitive Adhesive Layer Forming Step]

The pressure sensitive adhesive layer forming step is a step of forming a pressure sensitive adhesive layer on the surface of the insulating base and the protrusions of the conductive paths after the trimming step.

Here, as the method of forming the pressure sensitive adhesive layer, for example, a method of applying a resin composition containing an antioxidant material, a polymer material, and a solvent (for example, methyl ethyl ketone or the like) to the surface of the insulating base and the protrusions of the conductive paths and drying the resin composition, and baking the resin composition if required may be used.

The method of applying the resin composition is not particularly limited and for example, conventionally known coating methods such as a gravure coating method, a reverse coating method, a die coating method, and coating using a blade coater, a roll coater, an air knife coater, a screen coater, a bar coater, and a curtain coater can be used.

In addition, the drying method after coating is not particularly limited and for example, a treatment of carrying out heating at a temperature of 0° C. to 100° C. for several seconds to several tens of minutes under atmospheric air and a treatment of carrying out heating at a temperature of 0° C. to 80° C. for several seconds to several tens of minutes under a reduced pressure may be carried out.

The baking method after drying is not particularly limited because the baking method differs depending on a polymer material to be used. In the case of using a polyimide resin, for example, a treatment of carrying out heating at a temperature of 160° C. to 240° C. for 2 minutes to 1 hour or the like may be used. In the case of using an epoxy resin, for example, a treatment of carrying out heating at a temperature of 30° C. to 80° C. for 2 to 60 minutes or the like may be used.

In the production method of the present invention, each of the above-described steps can be carried out on each sheet and can be continuously carried out on a web obtained by using a coil of aluminum as a raw sheet.

In addition, in the case of continuously carrying out these steps, it is preferable to provide appropriate washing step and drying step between each of the steps.

[Semiconductor Device]

Hereinafter, a semiconductor device of the present invention and the production method thereof will be described in detail.

The semiconductor device of the present invention is a device formed by laminating the above-described anisotropic conductive bonding member of the present invention and a wiring substrate to be electrically connected to the conductive paths of the anisotropic conductive bonding member through an electrode.

In the semiconductor device of the present invention, as described in the semiconductor device production method described later, it is preferable that the pressure sensitive adhesive layer is cured after the electrodes in the wiring substrate and the anisotropic conductive bonding member of the present invention are mainly bonded.

The semiconductor device production method of the present invention is a semiconductor device production method including the above-described anisotropic conductive bonding member of the present invention, and a wiring substrate having a plurality of electrodes.

The semiconductor device production method of the present invention includes a temporary bonding process of bonding the anisotropic conductive bonding member and the wiring substrate by the pressure sensitive adhesive layer of the anisotropic conductive bonding member, a main bonding process of electrically bonding conductive paths of the anisotropic conductive bonding member and the electrodes of the wiring substrate, and a pressure sensitive adhesive layer curing process of curing the pressure sensitive adhesive layer of the anisotropic conductive bonding member in this order.

Next, the semiconductor device production method of the present invention and the structure thereof will be described using FIGS. 2A to 2F and FIGS. 3A to 3F.

Figure 2A:
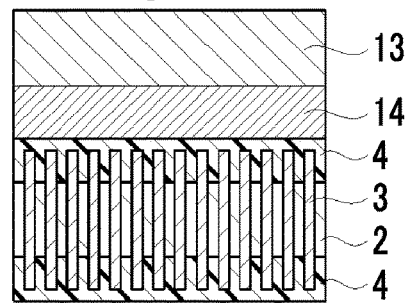
FIG. 2A is a cross-sectional view before temporary bonding of an anisotropic conductive bonding member and a wiring substrate out of schematic cross-sectional views for illustrating an example of a semiconductor device production method of the present invention.
Figure 2A:
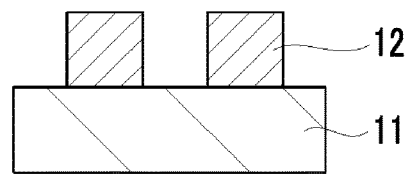
Figure 2B:
FIG. 2B is a cross-sectional view when the anisotropic conductive bonding member and the wiring substrate are temporarily bonded out of the schematic cross-sectional views for illustrating the example of the semiconductor device production method of the present invention.
Figure 2B:
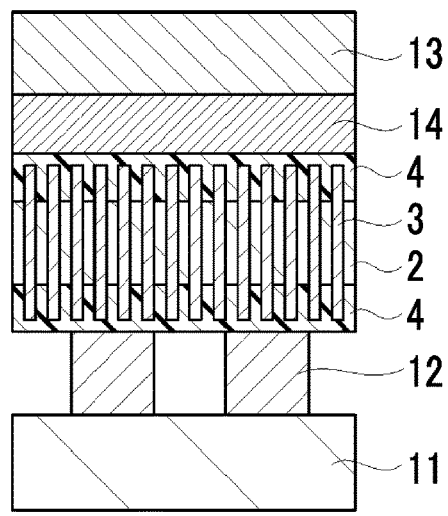

As shown in FIGS. 2A and 2B, the pressure sensitive adhesive layer 4 of the anisotropic conductive bonding member (reference numeral 2: insulating base, reference numeral 3: conductive path, and reference numeral 4: pressure sensitive adhesive layer) fixed to a temporary support 13 by an adhesive 14 and the electrodes 12 provided on the wiring substrate 11 are temporarily bonded.

Figure 2C:
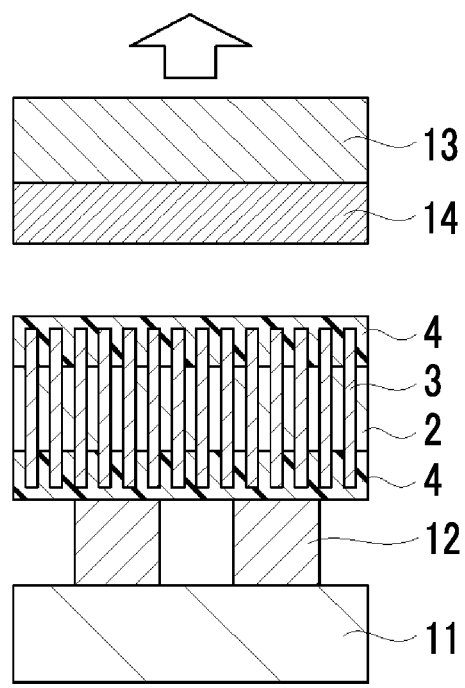
FIG. 2C is a cross-sectional view in a case where a temporary support is peeled off out of the schematic cross-sectional views for illustrating the example of the semiconductor device production method of the present invention.
Figure 2D:
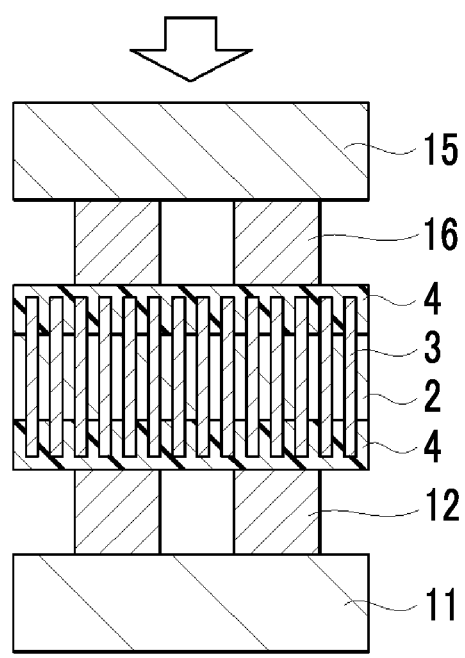
FIG. 2D is a cross-sectional view in a case where a semiconductor chip is temporarily bonded to the anisotropic conductive bonding member out of the schematic cross-sectional views for illustrating the example of the semiconductor device production method of the present invention.

After the anisotropic conductive bonding member and the wiring substrate are temporarily bonded, as shown in FIG. 2C, the temporary support 13 and the adhesive 14 are peeled off together, and then as shown in FIG. 2D, electrodes 16 provided on the semiconductor chip 15 are temporarily bonded to the pressure sensitive adhesive layer 4 of the anisotropic conductive bonding member.

Figure 2E:
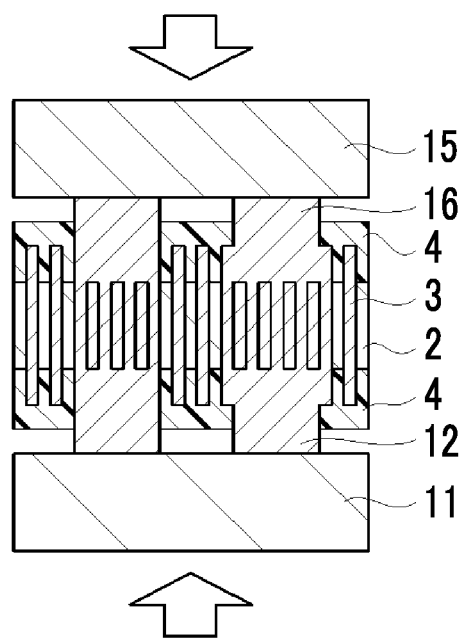
FIG. 2E is a cross-sectional view in a case where the semiconductor chip, the anisotropic conductive bonding member, and the wiring substrate are mainly bonded out of the schematic cross-sectional views for illustrating the example of the semiconductor device production method of the present invention.

A laminate in which the semiconductor chip, the anisotropic conductive bonding member, and the wiring substrate are temporarily bonded by the temporary bonding process shown in FIGS. 2A to 2D is prepared and then as shown in FIG. 2E, under the condition that a predetermined pressure is applied from an arrow direction, the semiconductor chip, the anisotropic conductive bonding member, and the wiring substrate, which have been temporarily bonded, are mainly bonded.

Figure 2F:
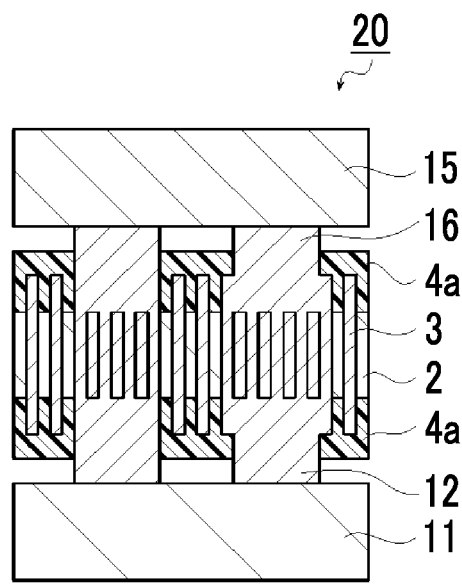
FIG. 2F is a cross-sectional view in a case where a pressure sensitive adhesive layer is cured after the semiconductor chip, the anisotropic conductive bonding member, and the wiring substrate are mainly bonded out of the schematic cross-sectional views for illustrating the example of the semiconductor device production method of the present invention.

A semiconductor device 20 can be prepared by curing the pressure sensitive adhesive layer 4 of the anisotropic conductive bonding member as shown in FIG. 2F after the main bonding.

Figure 3A:
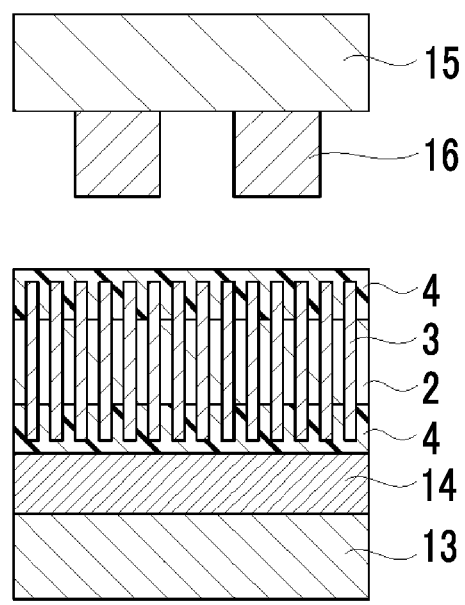
FIG. 3A is a cross-sectional view before temporary bonding of a semiconductor chip and an anisotropic conductive bonding member out of schematic cross-sectional views for illustrating another example of a semiconductor device production method of the present invention.
Figure 3B:
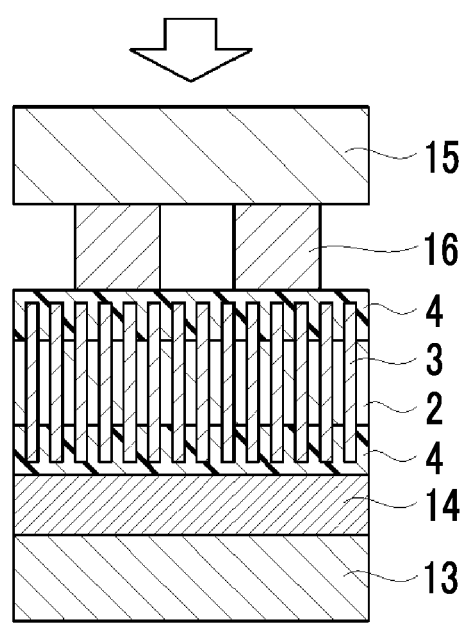
FIG. 3B is a cross-sectional view when the semiconductor chip and the anisotropic conductive bonding member are temporarily bonded out of the schematic cross-sectional views for illustrating the other example of the semiconductor device production method of the present invention.

As shown in FIGS. 3A and 3B, the pressure sensitive adhesive layer 4 of the anisotropic conductive bonding member (reference numeral 2: insulating base, reference numeral 3: conductive path, and reference numeral 4: pressure sensitive adhesive layer) fixed to the temporary support 13 by the adhesive 14 and the electrodes 16 provided on the semiconductor chip 15 are temporarily bonded.

Figure 3C:
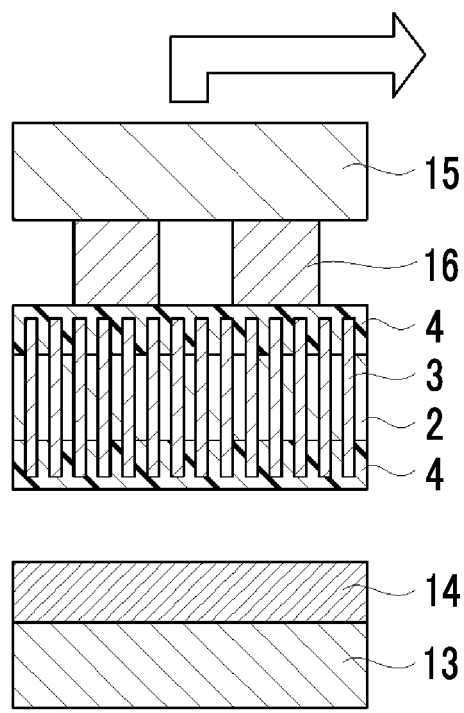
FIG. 3C is a cross-sectional view in a case where the semiconductor chip and the anisotropic conductive bonding member which have been temporarily bonded are peeled off from a temporary support out of the schematic cross-sectional views for illustrating the other example of the semiconductor device production method of the present invention.
Figure 3D:
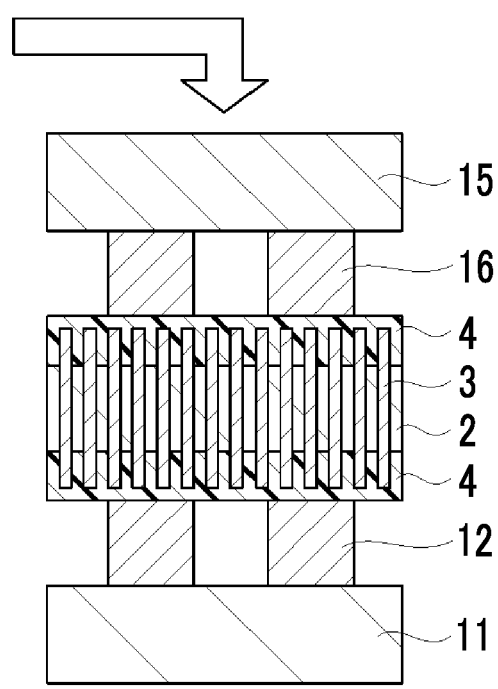
FIG. 3D is a cross-sectional view in a case where the semiconductor chip and the anisotropic conductive bonding member which have been temporarily bonded are temporarily bonded to a wiring substrate out of the schematic cross-sectional views for illustrating the other example of the semiconductor device production method of the present invention.

After the anisotropic conductive bonding member and the semiconductor chip are temporarily bonded, as shown in FIG. 3C, the laminate in which the anisotropic conductive bonding member and the semiconductor chip are temporarily bonded is peeled off from the adhesive 14 of the temporary support 13 and then as shown in FIG. 3D, the electrodes 12 provided on the wiring substrate 11 and the pressure sensitive adhesive layer 4 of the anisotropic conductive bonding member are temporarily bonded.

After the laminate in which the semiconductor chip, the anisotropic conductive bonding member, and the wiring substrate are temporarily bonded by the temporary bonding process shown in FIGS. 3A to 3D is prepared, as shown in FIG. 3E, under the condition that a predetermined pressure is applied from an arrow direction, the semiconductor chip, the anisotropic conductive bonding member, and the wiring substrate, which have been temporarily bonded, are mainly bonded.

A semiconductor device 30 can be prepared by curing the pressure sensitive adhesive layer 4 of the anisotropic conductive bonding member as shown in FIG. 3F after the main bonding.

[Temporary Bonding Process]

In the present invention, it is preferable to perform the temporary bonding process by a chip on wafer (CoW) process. A semiconductor wafer and a semiconductor chip wafer are investigated to divide good chips and defective chips in advance (KGD: Known Good Die) and only good chips of the semiconductor chip wafer are bonded to a good portion in the semiconductor wafer so that loss can be reduced. In a case of temporary bonding, positional deviation occurs in steps (such as a transport step) before main bonding at a weak temporary bonding strength and thus the temporary bonding strength is important.

In the present invention, the temperature condition in the temporary bonding process is not particularly limited but the temperature is preferably 0° C. to 300° C., more preferably 10° C. to 200° C., and particularly preferably normal temperature (23° C.) to 100° C.

Similarly, the pressure application condition in the temporary bonding process is not particularly limited but the pressure is preferably 10 MPa or less, more preferably 5 MPa or less, and particularly preferably 1 MPa or less.

[Main Bonding Process]

In the present invention, the temperature condition in the main bonding process is not particularly limited but the temperature is preferably higher than the temperature of the temporary bonding process. Specifically, the temperature is more preferably 150° C. to 350° C. and particularly preferably 200° C. to 300° C.

The pressure application condition in the main bonding process is not particularly limited but the pressure is preferably 30 MPa or less and more preferably 0.1 to 20 MPa.

The time for the main bonding process is not particularly limited but the time is preferably 1 second to 60 minutes and more preferably 5 seconds to 10 minutes.

By performing the main bonding process under the above-described conditions, the pressure sensitive adhesive layer that covers the protrusion of each of the conductive paths of the anisotropic conductive bonding member hardly flows between the electrodes of the wiring substrate and the semiconductor chip and remains in the bonded portion.

The main bonding process may be performed for each chip but is preferably collectively performed on the wafer from the viewpoint of reducing the tact time.

[Pressure Sensitive Adhesive Layer Curing Process]

In the present invention, the temperature condition in the pressure sensitive adhesive layer curing process is not particularly limited but the temperature is preferably higher than the temperature of the main bonding process. Specifically, the temperature is more preferably 180° C. to 400° C. and particularly preferably 200° C. to 300° C.

The time for the pressure sensitive adhesive layer curing process is not particularly limited but the time is preferably 120 minutes or longer from the viewpoint of sufficiently accelerating curing of the pressure sensitive adhesive layer.

The pressure sensitive adhesive layer curing process may also function as the above-described main bonding process and may be performed as it is after the main bonding process. The pressure sensitive adhesive layer curing process may be performed for each chip similar to the main bonding process but is preferably collectively performed on the wafer from the viewpoint of reducing the tact time.

[Optional Process]

The semiconductor device production method of the present invention preferably includes a resin filling process of filling a gap between the plurality of electrodes of the wiring substrate with an insulating resin before the temporary bonding process for the reason of preventing oxidation of the electrodes and further improving conduction reliability.

For the same reason, the semiconductor device production method of the present invention preferably includes an underfill material filling process of filling a gap between the anisotropic conductive bonding member and the wiring substrate with an underfill material after the pressure sensitive adhesive layer curing process.

Next, the above-described temporary bonding process, main bonding process and pressure sensitive adhesive layer curing process, and the like will be described in comparison with conventional examples using FIGS. 4A to 4F, 5A to 5D, and 6A to 6C.

Figure 4B:
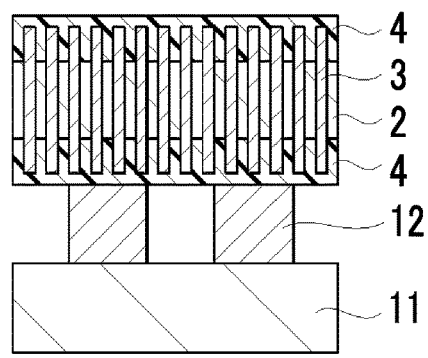
FIG. 4B is a cross-sectional view when the anisotropic conductive bonding member and the wiring substrate are temporarily bonded out of the schematic cross-sectional views for illustrating the bonding process of the anisotropic conductive bonding member of the present invention.

As shown in FIGS. 4A and 4B, the pressure sensitive adhesive layer 4 of the anisotropic conductive bonding member (reference numeral 2: insulating base, reference numeral 3: conductive path, reference numeral 4: pressure sensitive adhesive layer) and the electrodes 12 provided on the wiring substrate 11 are temporarily bonded.

Figure 4C:
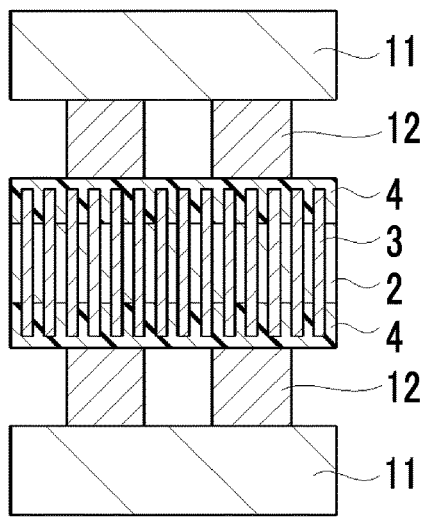
FIG. 4C is a cross-sectional view when the wiring substrate, the anisotropic conductive bonding member, and another wiring substrate are temporarily bonded out of the schematic cross-sectional views for illustrating the bonding process of the anisotropic conductive bonding member of the present invention.

After the anisotropic conductive bonding member and the wiring substrate are temporarily bonded, as shown in FIG. 4C, electrodes 12 provided on another wiring substrate 11 and the pressure sensitive adhesive layer 4 of the anisotropic conductive bonding member are temporarily bonded.

Figure 4D:
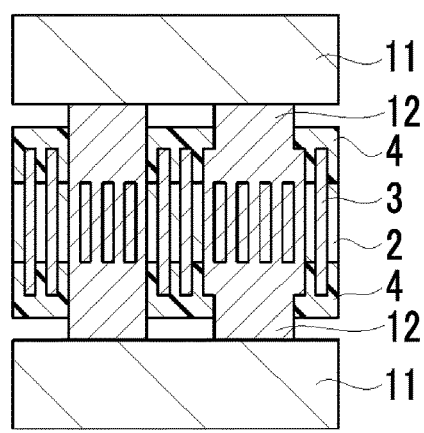
FIG. 4D is a cross-sectional view in a case where the wiring substrate, the anisotropic conductive bonding member, and the other wiring substrate are mainly bonded out of the schematic cross-sectional views for illustrating the bonding process of the anisotropic conductive bonding member of the present invention.

A laminate in which the wiring substrate, the anisotropic conductive bonding member, and the wiring substrate are temporarily bonded by the temporary bonding process shown in FIGS. 4A to 4C is prepared and then as shown in FIG. 4D, under the condition that a predetermined pressure is applied from an arrow direction, the wiring substrate, the anisotropic conductive bonding member, and the wiring substrate, which have been temporarily bonded, are mainly bonded.

Figure 4E:
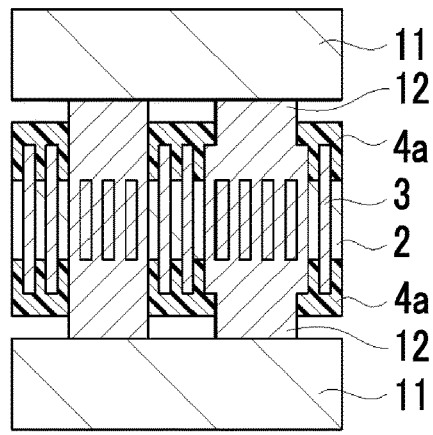
FIG. 4E is a cross-sectional view in a case where a pressure sensitive adhesive layer is cured after the wiring substrate, the anisotropic conductive bonding member, and the other wiring substrate are mainly bonded out of the schematic cross-sectional views for illustrating the bonding process of the anisotropic conductive bonding member of the present invention.

A multilayer wiring substrate 40 having a cured pressure sensitive adhesive layer 4a obtained by curing the pressure sensitive adhesive layer 4 of the anisotropic conductive bonding member as shown in FIG. 4E after the main bonding can be prepared.

Figure 4F:
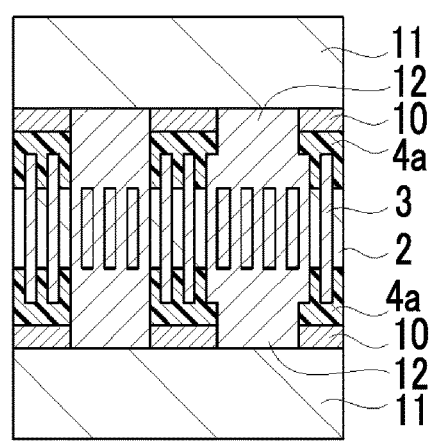
FIG. 4F is a cross-sectional view in a case where filling with an underfill is performed after the pressure sensitive adhesive layer is cured out of the schematic cross-sectional views for illustrating the bonding process of the anisotropic conductive bonding member of the present invention.

In addition, the multilayer wiring substrate 40 in which the underfill 10 is filled after the pressure sensitive adhesive layer is cured can be prepared as shown in FIG. 4F.

Figure 5A:
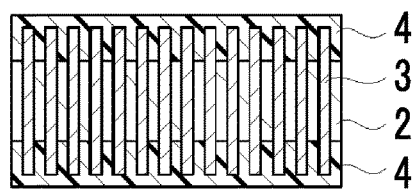
FIG. 5A is a cross-sectional view before temporary bonding of an anisotropic conductive bonding member and a wiring substrate out of schematic cross-sectional views for illustrating a comparative bonding process of the anisotropic conductive bonding member.
Figure 5A:
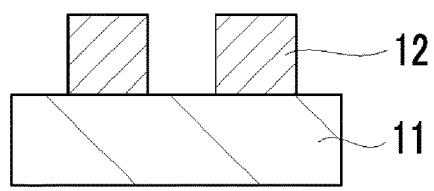
Figure 5B:
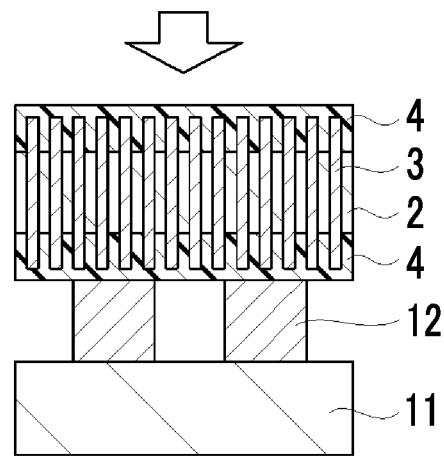
FIG. 5B is a cross-sectional view when the anisotropic conductive bonding member and the wiring substrate are temporarily bonded out of the schematic cross-sectional views for illustrating the comparative bonding process of the anisotropic conductive bonding member.
Figure 5C:
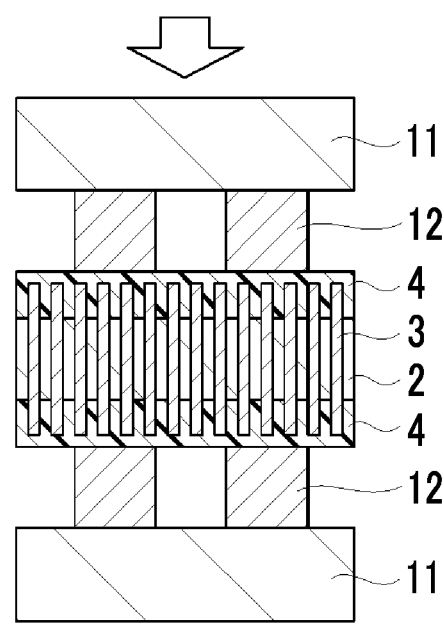
FIG. 5C is a cross-sectional view when the wiring substrate, the anisotropic conductive bonding member, and another wiring substrate are temporarily bonded out of the schematic cross-sectional views for illustrating the comparative bonding process of the anisotropic conductive bonding member.
Figure 5D:
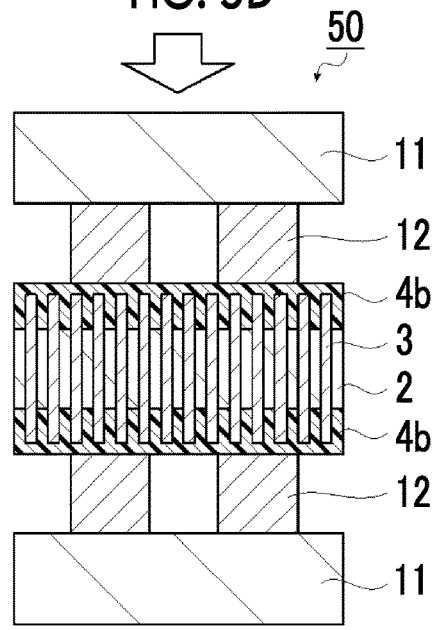
FIG. 5D is a cross-sectional view in a case where a pressure sensitive adhesive layer is cured before the wiring substrate, the anisotropic conductive bonding member, and the other wiring substrate are mainly bonded out of the schematic cross-sectional views for illustrating the comparative bonding process of the anisotropic conductive bonding member.

On the other hand, in a comparative bonding process shown in FIGS. 5A to 5D, the pressure sensitive adhesive layer of the laminate of the wiring substrate, the anisotropic conductive bonding member, and the wiring substrate temporarily bonded in the same manner as in FIGS. 4A to 4C is cured as shown in FIG. 5D before main bonding.

In such a comparative bonding process, as shown in FIG. 5D, the electrodes 12 of the wiring substrate and the conductive paths 3 of the anisotropic conductive bonding member are not bonded and not conducted to each other.

Figure 6A:
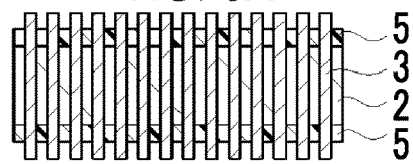
FIG. 6A is a cross-sectional view before an anisotropic conductive bonding member and a wiring substrate are temporarily bonded out of schematic cross-sectional views for illustrating a bonding process of an anisotropic conductive bonding member from which conductive paths protrude.
Figure 6A:
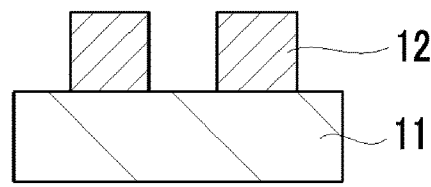
Figure 6B:
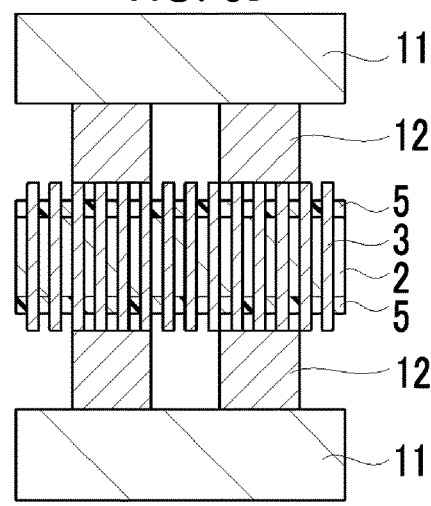
FIG. 6B is a cross-sectional view when the wiring substrate, the anisotropic conductive bonding member, and another wiring substrate are temporarily bonded out of the schematic cross-sectional views for illustrating the bonding process of the anisotropic conductive bonding member from which the conductive paths protrude.
Figure 6C:
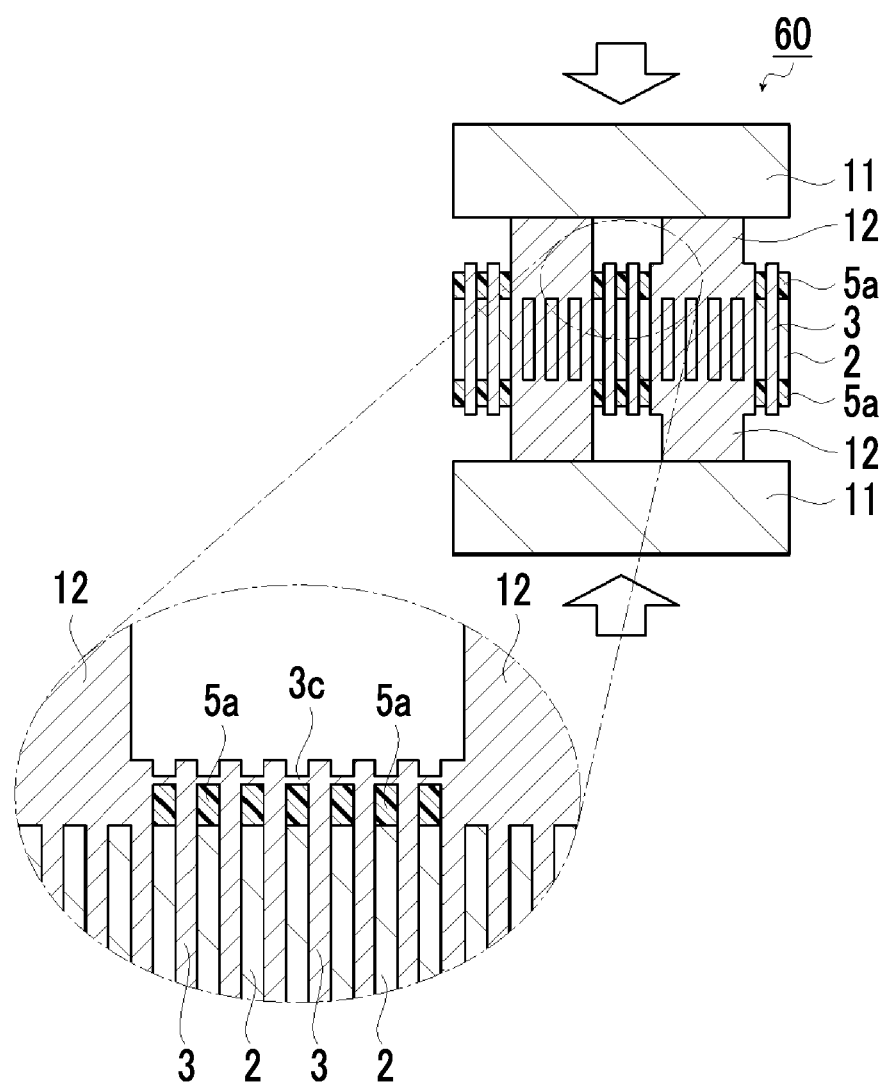
FIG. 6C is a cross-sectional view and an enlarged cross-sectional view in a case where the wiring substrate, the anisotropic conductive bonding member, and the other wiring substrate are mainly bonded out of the schematic cross-sectional views for illustrating the bonding process of the anisotropic conductive bonding member from which the conductive paths protrude.

In an aspect shown in FIGS. 6A to 6C, an anisotropic conductive bonding member in which portions of the conductive paths 3 protruding from the insulating base 2 also protrudes from a pressure sensitive adhesive layer 5 is adopted.

In a case of using such an anisotropic conductive bonding member, even though the same temporary bonding process, main bonding process, and pressure sensitive adhesive layer curing process as in the present invention are performed, as shown in an enlarged view of FIG. 6C, migration of metal easily occurs between the bonded portion and the protrusion of each of the conductive paths 3 around the bonded portion (reference numeral: 3c) and as a result, conduction reliability is deteriorated. The reference numeral 5a indicates a layer obtained by curing the pressure sensitive adhesive layer 5.

[Semiconductor Package]

A semiconductor package of the present invention is a semiconductor package using the semiconductor device of the present invention and for example, a laminate in which anisotropic conductive bonding member of the present invention and a plurality of semiconductor chips are laminated on one wiring substrate, a laminate in which the multilayer wiring substrate 40 shown in FIG. 4E or 4F, the anisotropic conductive bonding member of the present invention, and a semiconductor chip are laminated, and the like may be adopted.

Examples of the semiconductor chip to be bonded with the anisotropic conductive bonding member of the present invention include memories, image sensors, logic, and power semiconductors.

Examples of the semiconductor package include micro electro mechanical systems (MEMS), a field-programmable gate array (FPGA), and a communication module, and a combination of these packages for realizing Internet of Things (IoT) can also be applied.

EXAMPLES

Hereinafter, the present invention will be described specifically with reference to the examples. However, the present invention is not limited thereto.

Examples 1-1 and 1-2

A commercially available photosensitive glass substrate (trade name: PEG3 manufactured by HOYA Corporation: having a size of 5-inch square and a plate thickness of 0.65 mm) was irradiated with ultraviolet rays with a photo mask closely attached thereto. The conditions for irradiation were such that the wavelength was 320 nm and the exposure amount was 550 mJ/cm$^2$. In addition, for the mask pattern, a mask pattern in which total 90,000 circle patterns each having a diameter of 1 μm were arranged at a pitch of 300 μm in the horizontal and vertical directions was used.

After the laminate was irradiated with ultraviolet rays, a heat treatment was performed in a heating furnace at 550° C. for 1 hour.

Then, the surface and the rear surface of the photosensitive glass substrate were ground by a double-side surface grinding machine using abrasive particles made of $Al_2O_3$ and having a particle size of #1,000, and further subjected to finishing polishing by a double-side polishing machine using cerium oxide abrasive particles. The plate thickness of the photosensitive glass substrate subjected to the finishing polishing was 0.3 mm and a total machining allowance of the surface and the rear surface was 0.35 mm.

Next, a photosensitive polyimide resin or epoxy resin composition, which will be described later, was applied to have a film thickness of 2 µm and exposure development was carried out using the same mask pattern such that the position of the circle pattern overlapped with the position of the above circle pattern.

Then, the exposed portions of the photosensitive glass were dissolved and removed using an acid mixed etching solution obtained by adding sulfuric acid to a 7 vol % aqueous hydrofluoric acid solution (sulfuric acid concentration: 20 wt %).

Next, a copper electrode was closely attached to one surface of the glass substrate and electrolytic plating was carried out using the copper electrode as a cathode and using platinum as a positive electrode.

A mixed solution of copper sulfate/sulfuric acid/hydrochloric acid=200/50/15 g/L in a state in which the mixed solution is kept at 25° C. was used as an electrolytic solution and constant voltage pulse electrolysis was performed. Thus, a structure having through-holes filled with copper (anisotropic conductive bonding member precursor) was produced.

Here, the constant voltage pulse electrolysis was performed in such a manner that cyclic voltammetry was performed in the plating solution using a plating apparatus manufactured by Yamamoto-MS Co., Ltd. and a power supply (HZ-3000) manufactured by Hokuto Denko Corporation to confirm the deposition potential, and then the potential of the copper electrode closely attached to the glass was set to −2 V. In addition, the pulse waveform of the constant voltage pulse electrolysis was a rectangular wave. Specifically, the time for one electrolytic treatment was set to 60 seconds so that the total time of electrolytic treatment is 300 seconds and the pause time between each electrolytic treatment was set to 40 seconds. The electrolytic treatment was carried out 5 times.

In a case where the surface after the through-holes were filled with copper was observed with a field emission scanning electron microscope (FE-SEM), the copper partially overflowed from the surface of the resin layer of the unexposed portion.

(Polyimide Resin)

As the polyimide resin, a photosensitive polyimide resin (alkaline development positive photosensitive polyimide: PIMEL AM-200 Series, manufactured by Asahi Kasei E-Materials Co., Ltd.) was used.

(Epoxy Resin Composition)

10 parts of bisphenol A type epoxy resin having an epoxy equivalent of 250 g/eq, as a low epoxy equivalent epoxy resin, 90 parts of bisphenol F type phenoxy resin having an epoxy equivalent of 8,690 g/eq, as a high epoxy equivalent epoxy resin, and 9 parts of 4,4-bis[di(β-hydroxyethoxy)phenylsulfonyl]phenylsulfide-bis(hexafluoroantimonate) as a photoacid generator were dissolved in dioxane to prepare a photosensitive epoxy resin adhesive composition having a concentration of solid contents of 50%.

Thereafter, the resin layer was heated to 80° C. and the surface was polished in the same manner as described above. Then, a pressure sensitive adhesive layer was formed by a method described below and thus an anisotropic conductive bonding member in which the kind of the pressure sensitive adhesive layer was changed was prepared.

<Polyimide Resin A>

A coating solution having the following composition was prepared and then filtered through a polypropylene filter having a pore diameter of 0.2 µm.

With this coating solution, an antioxidant material A [benzotriazole, formulation amount (the amount with respect to the solid content of the pressure sensitive adhesive layer): 0.01% by mass] and a migration prevention material A (trade name IXE "IXE-100" manufactured by Toagosei Co., Ltd., median diameter: 1 µm, cation exchange, heat resistance temperature: 550° C.) were formulated, and thus a resin forming solution was prepared.

Next, the filtered coating solution was applied to the surface of the insulating base from which the conductive paths protruded and dried to form a pressure sensitive adhesive layer. The thickness of the pressure sensitive adhesive layer was adjusted by further adding a solvent (MEK) to the coating solution of the following formulation to have a value shown in Table 1 below.

(Composition of Coating solution)

| | |
|---|---|
| Polyimide represented by the following formula | 10.00% by mass |
| Methyl ethyl ketone (MEK) | 90.00% by mass |

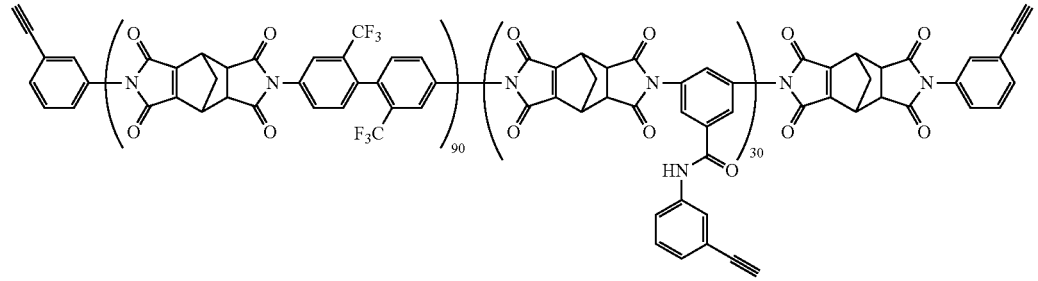

<Epoxy Resin C>

The components shown below were dissolved in methyl ethyl ketone at the following ratio to prepare a resin layer coating solution having a concentration of solid contents of 23.6% to 60.6% by weight.

The coating solution was applied to the surface of the insulating base in which the conductive paths protruded and dried to form a pressure sensitive adhesive layer.

The thickness of the pressure sensitive adhesive layer was adjusted by further adding a solvent (MEK) to the coating solution of the following formulation to have a value shown in Table 1 below.

The applied coating solution was dried at a temperature of 50° C. under reduced pressure of a degree of pressure reduction of −400 mmH$_2$O to avoid surface solidification of the pressure sensitive adhesive layer.

<Coating Solution Composition>

Elastomer: acrylic acid ester-based polymer having butyl acrylate and acrylonitrile as a main component (trade name: SG-28GM, manufactured by Nagase ChemteX Corporation) 5 Parts by Mass Epoxy resin 1: jER (registered trademark) 828 (manufactured by Mitsubishi Chemical Corporation) 33 parts by mass Epoxy resin 2: jER (registered trademark) 1004 (manufactured by Mitsubishi Chemicals Corporation) 11 parts by mass Phenolic resin: MILEX XLC-4L (manufactured by Mitsui Chemicals, Inc.) 44 parts by mass Organic acid: o-anisic acid (ortho anisic acid, manufactured by Tokyo Chemical Industry Co., Ltd.) 0.5 parts by mass Antioxidant material A: benzotriazole: 0.01% by mass (the amount with respect to the solid content of the pressure sensitive adhesive layer)

Migration prevention material A: trade name IXE "IXE-100" (manufactured by Toagosei Co., Ltd., median diameter: 1 μm, cation exchange, heat resistance temperature: 550° C.) 2.5% by mass Curing agent (liquid): 1-cyanoethyl-2-ethyl-4-methylimidazole (2E4MZ-CN, manufactured by Shikoku Chemicals Corporation) 0.5% by mass The prepared anisotropic conductive bonding member was observed with a field emission scanning electron microscope (FE-SEM).

As a result, as shown in Table 1 below, it was confirmed that the height of the protrusion of each of the conductive paths was 950 nm, the diameter of the protrusion of each of the conductive paths was 1,000 nm, the aspect ratio thereof (height of protrusion/diameter of protrusion) was 0.95, the interval between the conductive paths was 800 nm, and the thickness of the pressure sensitive adhesive layer was 1,000 nm.

Example 2, Examples 3-1 to 3-12, and Examples 4-1 and 4-2

(1) Preparation of Aluminum Substrate

Molten metal was prepared using an aluminum alloy containing Si: 0.06% by mass, Fe: 0.30% by mass, Cu: 0.005% by mass, Mn: 0.001% by mass, Mg: 0.001% by mass, Zn: 0.001% by mass, and Ti: 0.03% by mass, and a balance consisting of Al and unavoidable impurities and a molten metal treatment and filtration were carried out. Then, an ingot having a thickness of 500 mm and a width of 1,200 mm was prepared by a DC method.

Next, the surface of the resulted ingot was cut by a facing machine so as to have an average thickness of 10 mm and then heated at 550° C. for about 5 hours to carry out a soaking treatment. When the temperature decreased to 400° C., the ingot was formed into a rolled plate having a thickness of 2.7 mm by using a hot rolling mill.

Further, the heat treatment was conducted at 500° C. using a continuous annealing machine and then the annealed plate were cold-rolled to finish the plate to have a thickness of 1.0 mm, thereby obtaining a JIS 1050 aluminum substrate.

The aluminum substrate was cut into a width of 1,030 mm and then subjected to the respective treatments described below.

(2) Electropolishing Treatment

The aluminum substrate is subjected to an electropolishing treatment using an electropolishing solution having the following composition under the conditions of a voltage of 25 V, a solution temperature of 65° C., and a solution flow velocity of 3.0 m/min.

A carbon electrode was used as a cathode and GP0110-30R (manufactured by TAKASAGO LTD.) was used as a power supply. The flow velocity of the electrolytic solution was measured using a VORTEX FLOW MONITOR FLM 22-10 PCW (manufactured by AS ONE Corporation).

(Composition of Electropolishing Solution)

85 mass % phosphoric acid (manufactured by Wako Pure Chemical Industries, Ltd.): 660 mL Pure water: 160 mL Sulfuric acid: 150 mL Ethylene glycol: 30 mL (3) Anodizing Treatment Step Subsequently, an anodizing treatment using a self-regulation method was carried out on the aluminum substrate subjected to the electropolishing treatment according to the procedure described in JP2007-204802A.

The aluminum substrate subjected to the electropolishing treatment was subjected to 5 hours of a preliminary anodizing treatment with an electrolytic solution of 0.50 mol/L oxalic acid under the following conditions: voltage: 40 V; solution temperature: 16° C.; and solution flow velocity: 3.0 m/min.

After preliminary anodizing treatment, the aluminum substrate was subjected to a film removal treatment in which the substrate was immersed for 12 hours in a mixed aqueous solution (solution temperature: 50° C.) of 0.2 mol/L chromic anhydride and 0.6 mol/L phosphoric acid.

Then, the aluminum substrate was subjected to 10 hours of a re-anodizing treatment with an electrolytic solution of 0.50 mol/L oxalic acid under the following conditions: voltage, 40 V; solution temperature, 16° C.; and solution flow velocity, 3.0 m/min. An anodized film having a thickness of 80 μm was thus obtained.

The preliminary anodizing treatment and the re-anodizing treatment were both carried out using a stainless steel electrode as the cathode and using a GP0110-30R (manufactured by Takasago, Ltd.) as the power supply. NEO-COOL BD36 (Yamato Scientific Co., Ltd.) was used as the cooling device, and PAIRSTIRRER PS-100 (manufactured by Tokyo Rikakikai Co., Ltd.) was used as the stirring and warming unit. In addition, the flow velocity of the electrolytic solution was measured using the vortex flow monitor FLM22-10PCW (manufactured by As One Corporation).

(4) Barrier Layer Removal Step

Next, using the same treatment liquid as in the anodizing treatment under the same conditions as in the anodizing treatment, an electrolytic treatment (electrolytic removal treatment) was carried out while continuously decreasing the voltage from 40 V to 0 V at a voltage decrease rate of 0.2 V/sec.

Then, an etching treatment (etching removal treatment) of immersing the anodized film in 5 mass % phosphoric acid at 30° C. for 30 minutes was carried out. As a result, a barrier layer present in the bottom of the micropores of the anodized film was removed, and aluminum was exposed through the micropores.

Here, the average opening diameter of the micropores present in the anodized film having undergone the barrier layer removal step was 60 nm. The average opening diameter was calculated as the average value of opening diameters measured at 50 positions after capturing a surface image (magnification: 50,000 times) with FE-SEM.

In addition, the average thickness of the anodized film having undergone the barrier layer removal step was 80 μm. The average thickness was calculated as the average value of thicknesses measured at 10 positions after cutting the anodized film with a focused ion beam (FIB) in a thickness direction and capturing a surface image (magnification: 50,000 times) of the cross section with FE-SEM.

In addition, the density of the micropores present in the anodized film was about 100,000,000 pores/mm$^2$. The density of the micropores was measured and calculated using the method described in paragraphs [0168] and [0169] of JP2008-270158A.

In addition, the degree of regularity of the micropores present in the anodized film was 92%. The degree of regularity was measured and calculated using the method described in paragraphs [0024] to [0027] of JP2008-270158A after capturing a surface image (magnification: 20,000 times) with FE-SEM.

(5) Metal Filling Step (Electrolytic Plating Treatment)

Next, an electrolytic plating treatment was carried out by using the aluminum substrate as a cathode and using platinum as a positive electrode.

Specifically, constant current electrolysis was carried out using a copper plating solution having the following composition. As a result, a metal-filled microstructure was prepared in which the micropores were filled with copper.

Here, the constant current electrolysis was carried out using a plating apparatus (manufactured by Yamamoto-MS Co., Ltd.) and a power supply (HZ-3000, manufactured by Hokuto Denko Corp.) under the following conditions after carrying out cyclic voltammetry in the plating solution to check the deposition potential.

(Composition of Copper Plating Solution and Conditions)
Copper sulfate: 100 g/L
Sulfuric acid: 50 g/L
Hydrochloric acid: 15 g/L
Temperature: 25° C.
Current density: 10 A/dm$^2$ The surface of the anodized film in which the micropores were filled with the metal was observed with FE-SEM, and whether or not 1,000 micropores were sealed with the metal was observed to calculate a pore sealing ratio (the number of sealed micropores/1,000 pores). At this time, the pore sealing ratio was 96%.

In addition, the anodized film in which the micropores were filled with the metal was cut using FIB in a thickness direction, a surface image (magnification: 50,000 times) of a cross section was captured with FE-SEM, and the inside of the micropores was confirmed. At this time, it was found that the sealed micropores were completely filled with the metal.

(6) Substrate Removal Step

Next, the aluminum substrate was removed by dissolution by being immersed in 20 mass % mercury chloride aqueous solution (corrosive sublimate) at 20° C. for 3 hours. Thus, a metal-filled microstructure was prepared.

(7) Trimming Step

Next, the metal-filled microstructure was immersed in an aqueous sodium hydroxide solution (concentration: 5% by mass, solution temperature: 20° C.) and the time of immersion was changed to have a height of the protrusion shown in Table 1 below. The surface of the anodized film of aluminum (in Table 1 below, denoted as "AAO") was selectively dissolved to cause the copper columns which were conductive paths to protrude, thereby preparing a structure.

Next, the prepared structure was washed with water and dried, and then was observed with a field emission scanning electron microscope (FE-SEM). The height of the protrusions of the conductive paths, the diameter of the protrusions of the conductive paths, the aspect ratio (height of protrusion/diameter of protrusion), and the interval between the conductive paths were measured. The results are shown in Table 1 below.

(8) Pressure Sensitive Adhesive Layer Forming Step

A pressure sensitive adhesive layer was formed on the structure subjected to the trimming step by the following manner. Thus, an anisotropic conductive bonding member in which the kind of the pressure sensitive adhesive layer was changed was prepared.

<Polyimide Resin A>

The polyimide resin A was used to form a pressure sensitive adhesive layer in the same manner as in Examples 1-1 and 1-2 (hereinafter, also abbreviated as "Example 1").

<Epoxy Resin C>

The components shown below were dissolved in methyl ethyl ketone at the following ratio to prepare a resin layer coating solution having a concentration of solid contents of 23.6% to 60.6% by weight.

The coating solution was applied to the surface of the insulating base in which the conductive paths protruded and dried to form a pressure sensitive adhesive layer.

The thickness of the pressure sensitive adhesive layer was adjusted by further adding a solvent (MEK) to the coating solution of the following formulation to have a value shown in Table 1 below.

In addition, drying after the application was carried out by setting a temperature to 50° C. under reduced pressure of a degree of pressure reduction of −400 mmH$_2$O to avoid surface solidification of the pressure sensitive adhesive layer.

<Coating Solution Composition>
Elastomer: acrylic acid ester-based polymer having butyl acrylate and acrylonitrile as a main component (trade name: SG-28GM, manufactured by Nagase ChemteX Corporation) 5 parts by mass
Epoxy resin 1: jER (registered trademark) 828 (manufactured by Mitsubishi Chemical Corporation) 33 parts by mass
Epoxy resin 2: jER (registered trademark) 1004 (manufactured by Mitsubishi Chemicals Corporation) 11 parts by mass
Phenolic resin: MILEX XLC-4L (manufactured by Mitsui Chemicals, Inc.) 44 parts by mass
Organic acid: o-anisic acid (ortho anisic acid, manufactured by Tokyo Chemical Industry Co., Ltd.) 0.5 parts by mass
Antioxidant material: see below Migration prevention material: see below
Inorganic filler: see below
Curing agent: see below
(Antioxidant Material)
As the antioxidant material, 0.01% by mass (the amount with respect to the solid content of the pressure sensitive adhesive layer) of each of the following antioxidant materials also shown in Table 1 below was formulated.
Antioxidant material A: benzotriazole
Antioxidant material B: tolyltriazole
Antioxidant material C: 2-mercaptobenzothiazole
Antioxidant material D: phenol-based antioxidant Irganox 1010
Antioxidant material E: sulfur-based antioxidant Sumilizer TP-D
(Migration Prevention Material)
As the migration prevention material, 2.5% by mass of each of the following migration prevention materials also shown in Table 1 below was formulated. In Table 1 below, the example with "−" is an example in which no migration prevention material was formulated.
Migration prevention material A: trade name IXE "IXE-100" manufactured by Toagosei Co., Ltd., median diameter: 1 μm, cation exchange, heat resistance temperature: 550° C.
Migration prevention material B: trade name IXE "IXE-600" manufactured by Toagosei Co., Ltd., median diameter: 1 μm, cation and anion exchange, heat resistance temperature: 400° C.
(Inorganic Filler)
As the inorganic filler, 55% by mass of the inorganic filler A also shown in Table 1 below was formulated. In Table 1 below, the example with "−" is an example in which no inorganic filler was formulated.
Inorganic filler A: aluminum nitride nanoparticles, average particle diameter: 100 nm, manufactured by Sigma-Aldrich Co. LLC.
(Curing Agent)
As the curing agent, 0.5% by mass of the curing agent also shown in Table 1 below was formulated. In Table 1 below, the example with "−" is an example in which no curing agent was formulated.
Liquid: 1-cyanoethyl-2-ethyl-4-methylimidazole (2E4MZ-CN, manufactured by Shikoku Chemicals Corporation)
Solid: imidazole catalyst (2PHZ-PW, manufactured by Shikoku Chemicals Corporation)

Example 5

An anisotropic conductive bonding member was prepared in the same manner as in Examples 3-1 to 3-12 (hereinafter, also abbreviated as "Example 3") except that the thickness of the pressure sensitive adhesive layer was adjusted to a value shown in Table 1 below.

Example 6

An anisotropic conductive bonding member was prepared in the same manner as in Example 3 except that a pressure sensitive adhesive layer having an oxidation prevention layer and a polymer layer was formed in the following manner. In Table 1 below, "5/545" in the items of Example 6 such as thickness denotes values corresponding to each item of the oxidation prevention layer and the polymer layer.

<Formation of Oxidation Prevention Layer>
In a water solvent, 1% by mass of benzotriazole as an antioxidant material was dissolved to prepare a solution.
The solution was heated to 50° C. and then the insulating base from which the conductive paths protruded was immersed in the solution for 10 minutes and dried. Thus, as shown in FIG. 1D, the oxidation prevention layer 43 having a thickness of 5 nm was formed.
<Formation of Polymer Layer>
The polymer layer 44 having a thickness of 545 nm as shown in FIG. 1D was formed in the same manner as in the formation of the pressure sensitive adhesive layer using the epoxy resin C except that no antioxidant material was contained.

Example 7

An anisotropic conductive bonding member was prepared in the same manner as in Example 3 except that the pressure sensitive adhesive layer was formed in the following manner. In Table 1 below, "15/535" in the items of Example 7 such as thickness denotes values corresponding to each item of the first pressure sensitive adhesive layer and the second pressure sensitive adhesive layer.
<Formation of First Pressure Sensitive Adhesive Layer>
A coating solution in which the formulation amount of the antioxidant material A (benzotriazole) of the resin layer coating solution containing the epoxy resin C (the amount with respect to the solid content of the pressure sensitive adhesive layer) was changed to 1% by mass was prepared.
The first pressure sensitive adhesive layer 41 having a thickness of 15 nm as shown in FIG. 1C was formed using the coating solution.
<Formation of Second Pressure Sensitive Adhesive Layer>
A coating solution in which the antioxidant material A (benzotriazole) of the resin layer coating solution containing the epoxy resin C was not formulated was prepared.
The second pressure sensitive adhesive layer 42 (thickness: 535 nm) containing no antioxidant material was formed on the surface of the first pressure sensitive adhesive layer 41 using the coating solution as shown in FIG. 1C and the total film thickness of the pressure sensitive adhesive layers was 550 nm.

Comparative Example 1

An anisotropic conductive bonding member was prepared in the same manner as in Example 3 except that the thickness of the pressure sensitive adhesive layer was adjusted to have a value shown in Table 1 below and without formulating the antioxidant material and the migration prevention material, the resin, the inorganic filler, and the curing agent were changed as shown in Table 1 below.
Polyimide resin B: see below
Inorganic filler B: aluminum oxide, average particle diameter: 13 nm, manufactured by Sigma-Aldrich Co. LLC.
Solid: imidazole catalyst (2PHZ-PW, manufactured by Shikoku Chemicals Corporation)
<Polyimide Resin B>
As a commercially available product of polyamide acid ester solution (including dimethyl sulfoxide, trialkoxy amide carboxy silane, and oxime derivatives) using gamma-butyrolactone as a solvent, LTC9320 (manufactured by Fuji Film Electronics Materials Co., Ltd.) was used.

The prepared resin forming solution was applied to the surface of the insulating base from which the conductive paths protruded (including the protrusions of the conductive paths) and dried to form a pressure sensitive adhesive layer. The thickness of the pressure sensitive adhesive layer was adjusted by adding a solvent (MEK) to have a value shown in Table 1 below.

Comparative Example 2

An anisotropic conductive bonding member was prepared in the same manner as in Example 3 except that instead of the pressure sensitive adhesive layer forming step to be carried out after the trimming step, a polymer layer formed by curing a radical polymerizable monomer was formed by the method described in paragraph [0109] of JP2010-067589A to have a thickness of 100 µm and the end portions of the protrusions of the conductive paths were covered by the pressure sensitive adhesive layer.

Comparative Example 3

An anisotropic conductive bonding member was prepared in the same manner as in Example 3 except that the pressure sensitive adhesive layer was not used.

[Evaluation]
<TEG Chip>

A set of a TEG chip and an interposer each having a Cu pad was prepared. A daisy chain pattern for measuring conduction resistance and a comb teeth pattern for measuring insulation resistance are included in the TEG chip and the interposer. The insulation layer thereof was formed of SiN and a step between the insulation layer and the Cu pad was 15 µm. The TEG chip had a chip size of 8 mm square and two kinds of chips in which a ratio of the electrode area (copper post) to the chip area was 10% or 20% prepared. Since the interposer included lead wires in the vicinity thereof, an interposer having a chip size of 10 mm square was prepared.

Next, the TEG chip, the prepared anisotropic conductive bonding member, and the interposer were temporarily bonded using a chip bonder (DB250, manufactured by SHIBUYA CORPORATION) under the conditions for the temporary bonding process shown in Table 2 below such that the TEG chip, the prepared anisotropic conductive bonding member, and the interposer were laminated in this order. At this time, the Cu pads of the TEG chip and the interposer were aligned according to the alignment mark formed at the corners of the chip in advance not to cause positional deviation and temporarily bonded.

Next, the temporarily bonded sample was subjected to main bonding using a bonding apparatus (WP-100, manufactured by PMT Corporation) under the conditions for the main bonding process shown in Table 2 below. Then, regarding the mainly bonded sample, the pressure sensitive adhesive layer was cured under the conditions for the pressure sensitive adhesive layer curing process shown in Table 1 below to prepare a sample. In Table 2, an example in which these conditions are marked with "–" is an example in which the corresponding processes were not performed.

In Table 2 below, an example with "NCF" in the column of insulation layer of used chip is an example in which before the temporary bonding, a vacuum laminator was used to perform lamination at 150° C. for 3 minutes using a non conductive film (NCF) [NC0201, manufactured by NAMICS CORPORATION], which is a film type insulation film, on the electrode side.

In Table 2 below, an example with "underfill" in the column of insulation layer of the used chip is an example in which after the main bonding, U8410-314 manufactured by NAMICS CORPORATION was injected between the anisotropic conductive bonding member and the TEG chip and then cured.

<Conduction Reliability>

A signal line for resistance measurement was soldered to the pad of the daisy chain pattern portion of the interposer and the soldered sample was dried at 125° C. for 24 hours and further subjected to a moisture absorbing treatment at 85° C. and 60% RH for 168 hours. Subsequently, a solder reflow treatment step (maximum temperature: 265° C.) was performed three times.

The sample through the above history was supplied to a temperature cycle test under the condition of (−65° C./+150° C.).

The resistance value was measured for each 100th cycle and 1,000th cycle. As a result, a case where the rate of change of the resistance value was less than 5% was evaluated as "AA", a case where the rate of change of the resistance value was 5% or more and less than 10% was evaluated as "A", a case where the rate of change of the resistance value was 10% or more and less than 20% was evaluated as "B", a case where the rate of change of the resistance value was 20% or more and less than 40% was evaluated as "C", and a case where the rate of change of the resistance value was 40% or more was evaluated as "D". The results are shown in Table 3 below.

<Insulation Reliability>

A signal line for resistance measurement was soldered to the pad of the comb teeth pattern portion of the interposer and the soldered sample was dried at 125° C. for 24 hours and further subjected to a moisture absorbing treatment at 85° C. and 60% RH for 168 hours. Subsequently, a solder reflow treatment step (maximum temperature: 265° C.) was performed three times.

The sample through the above history was supplied to a temperature cycle test under the condition of (−65° C./+150° C.).

The resistance value was measured for each 100th cycle and 1,000th cycle. As a result, a case where the rate of change of the resistance value was less than 5% was evaluated as "AA", a case where the rate of change of the resistance value was 5% or more and less than 10% was evaluated as "A", a case where the rate of change of the resistance value was 10% or more and less than 20% was evaluated as "B", a case where the rate of change of the resistance value was 20% or more and less than 40% was evaluated as "C", and a case where the rate of change of the resistance value was 40% or more was evaluated as "D". The results are shown in Table 3 below.

<Adhesiveness>

A load was applied to the TEG chips of the sample for evaluation of conduction reliability and the sample after temporary bonding with respect to the sample prepared through the temporary bonding process and the peeling strength was measured using a universal bonding tester (DAGE 4000, manufactured by Nordson Corporation).

As a result, a case where the peeling strength was 15 N or more was evaluated as "A", a case where the peeling strength was 10 N or more and less than 15 N was evaluated as "B", and a case where the peeling strength was less than 10 N was evaluated as "C". The results are shown in Table 3 below.

<Thermal Properties>

The thermal conductivity of the sample for evaluation of conduction reliability in the thickness direction was measured using a thermal conductivity measurement apparatus (TCM-1000, manufactured by Rhesca Corporation).

As a result, a case where the thermal conductivity was 5 W/(m·K) or more was evaluated as "A", a case where the thermal conductivity was 1 W/(m·K) or more and less than 5 W/(m·K) was evaluated as "B", and a case where the thermal conductivity was less than 1 W/(m·K) was evaluated as "C". The results are shown in Table 3 below.

TABLE 1

|  |  | Insulating base | | Conductive path | | | | | Pressure sensitive adhesive layer |
|---|---|---|---|---|---|---|---|---|---|
|  |  |  |  |  | Protrusion | | | | |
|  |  | Kind | Thickness [μm] | Kind | Height [nm] | Diameter [nm] | Aspect ratio | Interval [nm] | Thickness [nm] |
| Example | 1-1 | Glass | 300 | Copper | 950 | 1,000 | 0.95 | 800 | 1,000 |
|  | 1-2 |  |  |  |  |  |  |  |  |
|  | 2 | AAO | 3 | Copper | 920 | 60 | 15.3 | 40 | 1,000 |
|  | 3-1 | AAO | 3 | Copper | 520 | 60 | 8.7 | 40 | 550 |
|  | 3-2 |  |  |  |  |  |  |  |  |
|  | 3-3 |  |  |  |  |  |  |  |  |
|  | 3-4 |  |  |  |  |  |  |  |  |
|  | 3-5 |  |  |  |  |  |  |  |  |
|  | 3-6 |  |  |  |  |  |  |  |  |
|  | 3-7 |  |  |  |  |  |  |  |  |
|  | 3-8 |  |  |  |  |  |  |  |  |
|  | 3-9 |  |  |  |  |  |  |  |  |
|  | 3-10 |  |  |  |  |  |  |  |  |
|  | 3-11 |  |  |  |  |  |  |  |  |
|  | 3-12 |  |  |  |  |  |  |  |  |
|  | 4-1 | AAO | 3 | Copper | 220 | 60 | 3.7 | 40 | 250 |
|  | 4-2 |  |  |  |  |  |  |  |  |
|  | 5 | AAO | 3 | Copper | 520 | 60 | 8.7 | 40 | 100,000 |
|  | 6 | AAO | 3 | Copper | 520 | 60 | 8.7 | 40 | 5/545 |
|  | 7 | AAO | 3 | Copper | 520 | 60 | 8.7 | 40 | 15/535 |
| Comparative Example | 1-1 | AAO | 3 | Copper | 520 | 60 | 8.7 | 40 | 500 |
|  | 1-2 |  |  |  |  |  |  |  |  |
|  | 1-3 |  |  |  |  |  |  |  |  |
|  | 1-4 |  |  |  |  |  |  |  |  |
|  | 1-5 |  |  |  |  |  |  |  |  |
|  | 2 | AAO | 3 | Copper | 520 | 60 | 8.7 | 40 | 100,000 |
|  | 3 | AAO | 3 | Copper | 520 | 60 | 8.7 | 40 | — |

|  |  | Pressure sensitive adhesive layer | | | | | |
|---|---|---|---|---|---|---|---|
|  |  |  | Antioxidant material | | Migration prevention material | Inorganic filler [nmφ] | Curing agent |
|  |  | Polymer material | Kind | Content [%] |  |  |  |
| Example | 1-1 | Polyimide resin A | A | 0.01 | A | — | — |
|  | 1-2 | Epoxy resin C | A | 0.01 | A | — | Liquid |
|  | 2 | Epoxy resin C | A | 0.01 | A | — | Liquid |
|  | 3-1 | Polyimide resin A | A | 0.01 | A | — | — |
|  | 3-2 | Epoxy resin C | A | 0.01 | A | — | Liquid |
|  | 3-3 | Epoxy resin C | B | 0.01 | A | — | Liquid |
|  | 3-4 | Epoxy resin C | C | 0.01 | A | — | Liquid |
|  | 3-5 | Epoxy resin C | A | 0.01 | B | — | Liquid |
|  | 3-6 | Epoxy resin C | A | 0.01 | — | — | Liquid |
|  | 3-7 | Epoxy resin C | A | 0.01 | A | — | Liquid |
|  | 3-8 | Epoxy resin C | A | 0.01 | A | 100 | — |
|  | 3-9 | Epoxy resin C | A | 0.01 | A | — | Liquid |
|  | 3-10 | Epoxy resin C | A | 0.01 | A | — | Liquid |
|  | 3-11 | Epoxy resin C | A | 0.01 | A | — | Solid |
|  | 3-12 | Epoxy resin C | A | 0.01 | A | — | Liquid |
|  | 4-1 | Epoxy resin C | A | 0.01 | A | — | Liquid |
|  | 4-2 | Epoxy resin C | D, E | 0.01 | A | — | Liquid |
|  | 5 | Epoxy resin C | A | 0.01 | A | — | — |
|  | 6 | None/Epoxy resin C | A/none | 100/0 | None/A | — | Liquid |
|  | 7 | Epoxy resin C/ Epoxy resin C | A/none | 1/0 | A/A | — | Liquid |
| Comparative Example | 1-1 | Polyimide resin A | — | 0 | — | — | — |
|  | 1-2 | Polyimide resin B | — | 0 | — | — | — |
|  | 1-3 | Polyimide resin A | — | 0 | — | 13 | — |
|  | 1-4 | Epoxy resin C | — | 0 | — | — | Solid |
|  | 1-5 | Epoxy resin C | — | 0 | — | — | Solid |

TABLE 1-continued

| | | | | | | | |
|---|---|---|---|---|---|---|---|
| 2 | Polymer layer | — | 0 | — | — | — | |
| 3 | — | — | 0 | — | — | — | |

TABLE 2

| | | Used chip | | Temporary bonding process | | | | Main bonding process |
|---|---|---|---|---|---|---|---|---|
| | | TEG chip Electrode area ratio | Insulation layer | Pressure [MPa] | Temperature [° C.] | Time [min] | Atmosphere | Pressure [MPa] |
| Example | 1-1 | 10% | — | 1 | 130 | 0.1 | Air | 4 |
| | 1-2 | 10% | — | 1 | 100 | 0.1 | Air | 4 |
| | 2 | 10% | — | 0.5 | 80 | 0.1 | Air | 4 |
| | 3-1 | 10% | — | 0.5 | 80 | 0.1 | Air | 4 |
| | 3-2 | 10% | — | 0.5 | 80 | 0.1 | Air | 4 |
| | 3-3 | 10% | — | 0.5 | 80 | 0.1 | Air | 4 |
| | 3-4 | 10% | — | 0.5 | 80 | 0.1 | Air | 4 |
| | 3-5 | 10% | — | 0.5 | 80 | 0.1 | Air | 4 |
| | 3-6 | 10% | — | 0.5 | 80 | 0.1 | Air | 4 |
| | 3-7 | 20% | — | 0.5 | 80 | 0.1 | Air | 4 |
| | 3-8 | 10% | — | 0.5 | 80 | 0.1 | Air | 4 |
| | 3-9 | 10% | NCF | 1 | 130 | 1 | Air | 4 |
| | 3-10 | 10% | Underfill | 0.5 | 80 | 0.1 | Air | 4 |
| | 3-11 | 10% | — | 0.5 | 80 | 0.1 | Air | 4 |
| | 3-12 | 10% | — | 0.5 | 80 | 0.1 | Air | 4 |
| | 4-1 | 10% | — | 0.5 | 80 | 0.1 | Air | 4 |
| | 4-2 | 10% | — | 0.5 | 80 | 0.1 | Air | 4 |
| | 5 | 10% | — | 5 | 150 | 5 | Air | 0.75 |
| | 6 | 10% | — | 0.5 | 80 | 0.1 | Air | 4 |
| | 7 | 10% | — | 0.5 | 80 | 0.1 | Air | 4 |
| Comparative Example | 1-1 | 10% | — | — | — | — | — | 4 |
| | 1-2 | 10% | — | — | — | — | — | 4 |
| | 1-3 | 10% | — | — | — | — | — | 4 |
| | 1-4 | 10% | — | 0.5 | 80 | 1 | Air | 4 |
| | 1-5 | 10% | — | 0.5 | 80 | 1 | Air | 4 |
| | 2 | 10% | — | — | — | — | — | 4 |
| | 3 | 20% | — | — | — | — | — | 0.75 |

| | | Main bonding process | | | Pressure sensitive adhesive layer curing process | | | |
|---|---|---|---|---|---|---|---|---|
| | | Temperature [° C.] | Time [min] | Atmosphere | Pressure [MPa] | Temperature [° C.] | Time [min] | Atmosphere |
| Example | 1-1 | 200 | 5 | Vacuum | — | — | — | — |
| | 1-2 | 200 | 5 | Vacuum | 0 | 300 | 10 | Vacuum |
| | 2 | 200 | 5 | Vacuum | 4 | 250 | 30 | Vacuum |
| | 3-1 | 200 | 5 | Vacuum | 4 | 250 | 30 | Vacuum |
| | 3-2 | 200 | 5 | Vacuum | 4 | 250 | 30 | Vacuum |
| | 3-3 | 200 | 5 | Vacuum | 4 | 250 | 30 | Vacuum |
| | 3-4 | 200 | 5 | Vacuum | 4 | 250 | 30 | Vacuum |
| | 3-5 | 200 | 5 | Vacuum | 4 | 250 | 30 | Vacuum |
| | 3-6 | 200 | 5 | Vacuum | 4 | 250 | 30 | Vacuum |
| | 3-7 | 200 | 5 | Vacuum | 4 | 250 | 30 | Vacuum |
| | 3-8 | 200 | 5 | Vacuum | 4 | 300 | 30 | Vacuum |
| | 3-9 | 200 | 5 | Vacuum | 4 | 250 | 30 | Vacuum |
| | 3-10 | 250 | 10 | Vacuum | 0 | 300 | 15 | Vacuum |
| | 3-11 | 200 | 5 | Vacuum | 4 | 250 | 30 | Vacuum |
| | 3-12 | 200 | 5 | Vacuum | 4 | 200 | 1,000 | Vacuum |
| | 4-1 | 200 | 5 | Vacuum | 4 | 250 | 30 | Vacuum |
| | 4-2 | 200 | 5 | Vacuum | 4 | 250 | 30 | Vacuum |
| | 5 | 300 | 1 | Air | 1 | 350 | 1 | Air |
| | 6 | 200 | 5 | Vacuum | 4 | 250 | 30 | Vacuum |
| | 7 | 200 | 5 | Vacuum | 4 | 250 | 30 | Vacuum |
| Comparative Example | 1-1 | 200 | 5 | Vacuum | — | — | — | — |
| | 1-2 | 200 | 5 | Vacuum | — | — | — | — |
| | 1-3 | 200 | 5 | Vacuum | — | — | — | — |
| | 1-4 | 200 | 5 | Vacuum | — | — | — | — |
| | 1-5 | 200 | 5 | Vacuum | 4 | 250 | 30 | Vacuum |
| | 2 | 200 | 5 | Vacuum | — | — | — | — |
| | 3 | 300 | 1 | Air | — | — | — | — |

TABLE 3

|  |  | Evaluation | | | | |
|---|---|---|---|---|---|---|
|  |  | Reliability | | Adhesiveness | | Thermal properties |
|  |  | | | Temporary | Main | |
|  |  | Conduction | Insulation | bonding | bonding | Heat dissipation |
| Example | 1-1 | A | A | AA | A | B |
|  | 1-2 | A | A | A | A | B |
|  | 2 | AA | A | A | AA | B |
|  | 3-1 | A | A | A | A | B |
|  | 3-2 | A | A | A | A | B |
|  | 3-3 | AA | A | A | A | B |
|  | 3-4 | B | A | A | A | B |
|  | 3-5 | A | AA | A | A | B |
|  | 3-6 | A | B | A | A | B |
|  | 3-7 | AA | A | AA | AA | A |
|  | 3-8 | A | AA | A | AA | AA |
|  | 3-9 | A | AA | AA | AA | B |
|  | 3-10 | AA | AA | A | AA | B |
|  | 3-11 | A | A | B | A | B |
|  | 3-12 | A | A | A | A | B |
|  | 4-1 | B | A | A | A | B |
|  | 4-2 | AA | A | A | A | B |
|  | 5 | AA | AA | AA | AA | B |
|  | 6 | AA | A | A | A | B |
|  | 7 | AA | A | A | A | B |
| Comparative Example | 1-1 | B | C | — | A | B |
|  | 1-2 | B | C | — | A | B |
|  | 1-3 | C | C | — | A | A |
|  | 1-4 | C | D | D | A | B |
|  | 1-5 | C | C | D | A | B |
|  | 2 | D | C | — | C | B |
|  | 3 | D | D | — | C | B |

As seen from the results shown in Tables 1 to 3, it was found that in the anisotropic conductive bonding member in which the protrusions of the conductive paths were not buried in the pressure sensitive adhesive layer and the pressure sensitive adhesive layer did not contain the antioxidant material, the insulation reliability was deteriorated (Comparative Example 1).

It was found that in the anisotropic conductive bonding member in which the pressure sensitive adhesive layer did not contain the antioxidant material even in a case where the protrusions of the conductive paths were buried in the pressure sensitive adhesive layer, the conduction reliability and the insulation reliability were deteriorated (Comparative Example 2).

In addition, it was found that in the anisotropic conductive bonding member not using the pressure sensitive adhesive layer, the conduction reliability and the insulation reliability were deteriorated (Comparative Example 3).

In contrast, it was found that in all of the anisotropic conductive bonding members in which the pressure sensitive adhesive layer contained the antioxidant material and the protrusions of the conductive paths protruding from the insulating base were buried in the pressure sensitive adhesive layer, the conduction reliability and the insulation reliability were excellent and the adhesiveness and thermal properties (heat dissipation) were also excellent (Examples 1 to 7).

From the results of Examples 4-1 and 4-2, it was found that in a case of using a phenol-based antioxidant and a sulfur-based antioxidant in combination as an antioxidant, the conduction reliability was further improved.

EXPLANATION OF REFERENCES

1: anisotropic conductive bonding member
2: insulating base
2a, 2b: surface of insulating base
3: conductive path
3a, 3b: protrusion of conductive path
3c: portion of conductive path short-circuited by migration
4, 5: pressure sensitive adhesive layer
4a, 5a: pressure sensitive adhesive layer after curing
6: thickness of insulating base
7: interval between conductive paths
8: diameter of conductive path
9: center-to-center distance (pitch) of conductive paths
10: underfill
11: wiring substrate
12: electrode
13: temporary support
14: adhesive
15: semiconductor chip
16: electrode
20, 30: semiconductor device
40, 50, 60: multilayer wiring substrate
41: first pressure sensitive adhesive layer
42: second pressure sensitive adhesive layer
43: oxidation prevention layer
44: polymer layer

What is claimed is:

1. An anisotropic conductive bonding member comprising:
an insulating base which is made of an inorganic material;
a plurality of conductive paths which are made of a conductive member, penetrate the insulating base in a thickness direction thereof, and are provided in a mutually insulated state; and
a pressure sensitive adhesive layer which is provided on a surface of the insulating base, wherein each of the conductive paths has a protrusion protruding from the surface of the insulating base, the protrusion of each of the conductive paths is buried in the pressure sensitive adhesive layer, the pressure sensitive adhesive layer contains an antioxidant material and a polymer material, and wherein in the pressure sensitive adhesive layer, the antioxidant material is eccentrically located on a side close to an interface between the protrusion of each of the conductive paths and the pressure sensitive adhesive layer.

2. The anisotropic conductive bonding member according to claim 1, wherein an aspect ratio of the protrusion of each of the conductive paths is 0.5 or more and less than 50, where the aspect ratio is a ratio of height to diameter of the protrusion.

3. The anisotropic conductive bonding member according to claim 1, wherein a height of the protrusion of each of the conductive paths is 50 nm to 3,000 nm.

4. The anisotropic conductive bonding member according to claim 1, wherein a thickness of the pressure sensitive adhesive layer is larger than the height of the protrusion of each of the conductive paths and is 100 µm or less.

5. The anisotropic conductive bonding member according to claim 1, wherein a difference between the height of the protrusion of each of the conductive paths and the thickness of the pressure sensitive adhesive layer is 1 nm to 99.95 µm.

6. The anisotropic conductive bonding member according to claim 1, wherein the polymer material is at least one resin material selected from the group consisting of polyimide resins and epoxy resins.

7. The anisotropic conductive bonding member according to claim 1, wherein the pressure sensitive adhesive layer contains a migration prevention material.

8. The anisotropic conductive bonding member according to claim 1, wherein an interval between the respective conductive paths is 5 nm to 800 nm.

9. The anisotropic conductive bonding member according to claim 1, wherein the pressure sensitive adhesive layer contains an inorganic filler, and an average particle diameter of the inorganic filler is larger than the interval between the respective conductive paths.

10. The anisotropic conductive bonding member according to claim 1, wherein the pressure sensitive adhesive layer contains a curing agent which is a liquid at 25° C.

11. A semiconductor device comprising:

the anisotropic conductive bonding member according to claim 1; and a wiring substrate which is electrically connected to the conductive paths of the anisotropic conductive bonding member through an electrode and is laminated with the anisotropic conductive bonding member.

12. A semiconductor package using the semiconductor device according to claim 11.

13. A semiconductor device production method for preparing a semiconductor device including the anisotropic conductive bonding member according to claim 1, and a wiring substrate having a plurality of electrodes, the method comprising, in order:

a temporary bonding process of bonding the anisotropic conductive bonding member and the wiring substrate by the pressure sensitive adhesive layer of the anisotropic conductive bonding member;

a main bonding process of electrically bonding conductive paths of the anisotropic conductive bonding member and the electrodes of the wiring substrate; and a pressure sensitive adhesive layer curing process of curing the pressure sensitive adhesive layer of the anisotropic conductive bonding member.

14. The semiconductor device production method according to claim 13, wherein temperature in the main bonding process is higher than temperature in the temporary bonding process.

15. The semiconductor device production method according to claim 13, wherein temperature in the pressure sensitive adhesive layer curing process is equal to or higher than temperature in the main bonding process.

16. The semiconductor device production method according to claim 13, further comprising:

a resin filling process of filling a gap between the plurality of electrodes of the wiring substrate with an insulating resin before the temporary bonding process.

17. The semiconductor device production method according to claim 13, further comprising:

an underfill material filling process of filling a gap between the anisotropic conductive bonding member and the wiring substrate with an underfill material after the pressure sensitive adhesive layer curing process.

* * * * *